(12) United States Patent
Nakajima et al.

(10) Patent No.: US 12,125,723 B2
(45) Date of Patent: Oct. 22, 2024

(54) HEAT TREATMENT METHOD AND HEAT TREATMENT APPARATUS

(71) Applicant: SCREEN Holdings Co., Ltd., Kyoto (JP)

(72) Inventors: Oma Nakajima, Kyoto (JP); Mao Omori, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 948 days.

(21) Appl. No.: 17/255,466

(22) PCT Filed: May 31, 2019

(86) PCT No.: PCT/JP2019/021826
§ 371 (c)(1),
(2) Date: Dec. 23, 2020

(87) PCT Pub. No.: WO2020/003894
PCT Pub. Date: Jan. 2, 2020

(65) Prior Publication Data
US 2021/0272827 A1  Sep. 2, 2021

(30) Foreign Application Priority Data

Jun. 25, 2018 (JP) ................................. 2018-119852
Jun. 29, 2018 (JP) ................................. 2018-124279
Jun. 29, 2018 (JP) ................................. 2018-124391

(51) Int. Cl.
*H01L 21/67* (2006.01)
*F27B 17/00* (2006.01)
(Continued)

(52) U.S. Cl.
CPC .... *H01L 21/67248* (2013.01); *F27B 17/0025* (2013.01); *F27D 21/04* (2013.01);
(Continued)

(58) Field of Classification Search
CPC ........... H01L 21/67248; H01L 21/2686; H01L 21/6715; H01L 21/26; H01L 22/12;
(Continued)

(56) References Cited

U.S. PATENT DOCUMENTS 4,859,832 A * 8/1989 Uehara ............. H01L 21/67115
219/405
2005/0063453 A1    3/2005 Camm et al.
(Continued)

FOREIGN PATENT DOCUMENTS

JP    2005-515425 A    5/2005
JP    2009-508337 A    2/2009
(Continued)

OTHER PUBLICATIONS

International Search Report mailed Aug. 6, 2019 in corresponding PCT International Application No. PCT/JP2019/021826.
(Continued)

*Primary Examiner* — Shawntina T Fuqua
(74) *Attorney, Agent, or Firm* — OSTROLENK FABER LLP

(57) ABSTRACT

The semiconductor wafer is preheated by halogen lamps and then heated by a flash of light irradiation from flash lamps. A length of a light emission waveform of a flash of light applied from the flash lamps can be adjusted as appropriate. A data collection cycle (sampling interval) of a radiation thermometer that measures a surface temperature of the semiconductor wafer is made variable, and the longer the light emission waveform of the flash of light, the longer the data collection cycle. Even when a rising and falling time of the surface temperature of the semiconductor wafer changes due to the length of the light emission waveform of a flash of light, a temperature change can be included in a temperature profile with a constant number of data points until the
(Continued)

surface temperature rises, goes through a maximum reaching temperature, and falls.

14 Claims, 13 Drawing Sheets

(51) Int. Cl.
    *F27D 21/04*     (2006.01)
    *G01J 5/00*     (2022.01)
    *G01J 5/10*     (2006.01)
    *H01L 21/268*     (2006.01)
    *H01L 21/66*     (2006.01)
    *H05B 1/02*     (2006.01)
    *H05B 3/00*     (2006.01)

(52) U.S. Cl.
    CPC .............. *G01J 5/0007* (2013.01); *G01J 5/10* (2013.01); *H01L 21/2686* (2013.01); *H01L 21/67115* (2013.01); *H01L 22/12* (2013.01); *H05B 1/0233* (2013.01); *H05B 3/0047* (2013.01)

(58) Field of Classification Search
    CPC .... F27B 17/0025; F27D 21/04; G01J 5/0007; G01J 5/10; H05B 1/0233; H05B 3/0047
    See application file for complete search history.

(56) References Cited

U.S. PATENT DOCUMENTS

| | | |
|---|---|---|
| 2006/0086713 A1 | 4/2006 | Hunter et al. |
| 2007/0069161 A1 | 3/2007 | Camm et al. |
| 2012/0076476 A1 | 3/2012 | Kusuda et al. |
| 2012/0076477 A1 | 3/2012 | Kuroiwa |
| 2015/0241272 A1 | 8/2015 | Lian et al. |
| 2018/0005848 A1 | 1/2018 | Aoyama et al. |
| 2018/0033628 A1 | 2/2018 | Tanimura |
| 2018/0254224 A1 | 9/2018 | Kitazawa et al. |
| 2020/0196389 A1* | 6/2020 | Ueno ............... H01L 21/67248 |
| 2022/0015213 A1* | 1/2022 | Kitagawa ............... G05D 23/20 |

FOREIGN PATENT DOCUMENTS

| | | |
|---|---|---|
| JP | 2012-069890 A | 4/2012 |
| JP | 2012-074430 A | 4/2012 |
| JP | 2012-156522 A | 8/2012 |
| JP | 2014-182061 A | 9/2014 |
| JP | 2017-009450 A | 1/2017 |
| JP | 2017-507501 A | 3/2017 |
| JP | 2018-148201 A | 9/2018 |
| TW | 2018-12918 A | 4/2018 |
| WO | WO-2007030941 A1 * | 3/2007 .......... F27B 17/0025 |

OTHER PUBLICATIONS

Written Opinion of the International Searching Authority mailed Aug. 6, 2019 in corresponding PCT International Application No. PCT/JP2019/021826.

International Preliminary Report on Patentability mailed Jan. 7, 2021 in corresponding PCT International Application No. PCT/JP2019/021826.

Office Action dated Nov. 20, 2020 in corresponding Taiwanese Patent Application No. 108121001 and Search Report with partial English translation based on attached Japanese translation.

Notice of Reasons for Refusal dated Oct. 5, 2021 in corresponding Japanese Patent Application No. 2018-119852 with English translation obtained from Global Dossier.

Notice of Reasons for Refusal dated Oct. 5, 2021 in corresponding Japanese Patent Application No. 2018-124279 with English translation obtained from Global Dossier.

Notice of Reasons for Refusal dated Oct. 5, 2021 in corresponding Japanese Patent Application No. 2018-124391 with English translation obtained from Global Dossier.

Office Action and Search Report dated Dec. 27, 2022 in corresponding Taiwanese Patent Application No. 110119553 and a machine generated English translation based on the Japanese translation of the original communication.

Notice of Decision to Grant dated May 3, 2022 in corresponding Korean Patent Application No. 10-2020-7037384.

* cited by examiner

| FLASH WAVEFORM (ms) | DATA COLLECTION CYCLE (μs) |
|---|---|
| 0 OR MORE AND LESS THAN 0.6 | 20 |
| 0.6 OR MORE AND LESS THAN 60 | 40 |
| 60 OR MORE AND LESS THAN 180 | 80 |

HEAT TREATMENT METHOD AND HEAT TREATMENT APPARATUS

CROSS-REFERENCE TO RELATED APPLICATIONS

The present application is a 35 U.S.C. §§ 371 national phase conversion of International Application No. PCT/JP2019/021826, filed May 31, 2019, which claims priority to Japanese Patent Application Nos. 2018-119852, 2018-124279 and 2018-124391, filed Jun. 25, 2018, Jun. 29, 2018 and Jun. 29, 2018, respectively, the contents of both of which are incorporated herein by reference. The PCT International Application was published in the Japanese language.

TECHNICAL FIELD

The present invention relates to a heat treatment method and a heat treatment apparatus which irradiate a thin plate-shaped precision electronic substrate (hereinafter simply referred to as "substrate") such as a semiconductor wafer with a flash of light to heat the substrate.

BACKGROUND ART

In a process for manufacturing a semiconductor device, impurity doping is an essential step for forming a p-n junction in a semiconductor wafer. At present, it is common to perform impurity doping by an ion implantation process and a subsequent annealing process. The ion implantation process is a technique for causing impurity elements such as boron (B), arsenic (As), and phosphorus (P) to ionize and to collide against the semiconductor wafer with high acceleration voltage, and physically performing impurity implantation. The implanted impurities are activated by the annealing process. On this occasion, when the annealing time is about several seconds or more, the impurities driven in are deeply diffused by heat, and as a result, the junction depth may become too large as compared with the required depth, which may hinder the formation of a good device.

Thus, in recent years, attention has been given to flash lamp annealing (FLA) as an annealing technique for heating a semiconductor wafer in an extremely short time. The flash lamp annealing is a heat treatment technique in which irradiating a surface of a semiconductor wafer with a flash of light using a xenon flash lamp (hereinafter, when the term "flash lamp" is simply used, it means a xenon flash lamp) raises the temperature of only the surface of the semiconductor wafer implanted with impurities in an extremely short time (several milliseconds or less).

The xenon flash lamp has a spectral distribution of radiation ranging from ultraviolet to near-infrared regions. The wavelength of light emitted from the xenon flash lamp is shorter than that of light emitted from a conventional halogen lamp, and approximately coincides with a fundamental absorption band of a silicon semiconductor wafer. Thus, when a semiconductor wafer is irradiated with a flash of light from the xenon flash lamp, the temperature of the semiconductor wafer can be rapidly raised with a small amount of transmitted light. In addition, it has also turned out that the irradiation with a flash of light in an extremely short time of several milliseconds or less allows a selective temperature rise only near the surface of the semiconductor wafer. Therefore, the temperature rise in an extremely short time with the xenon flash lamp allows only the activation of impurities to be achieved without deep diffusion of the impurities.

It is important to properly control the temperature of the semiconductor wafer not only in flash heating but also in heat treatment, and for that purpose, it is necessary to accurately measure the temperature of the semiconductor wafer during heat treatment. Typically, in heat treatment of semiconductor wafers, the temperature is measured by a non-contact radiation thermometer. Patent Document 1 discloses a technique of measuring with a radiation thermometer the surface temperature of a semiconductor wafer during irradiation with a flash of light and creating a temperature profile obtained by plotting the measured temperature on a time-series basis. Based on the obtained temperature profile, the maximum reaching temperature on the surface of the semiconductor wafer, the amount of heat input into the semiconductor wafer, and the like, during irradiation with a flash of light can be obtained.

PRIOR ART DOCUMENT

Patent Document

Patent Document 1: Japanese Patent Application Laid-Open No. 2017-009450

SUMMARY

Problem to be Solved by the Invention

In flash heating, the surface temperature history of the semiconductor wafer changes depending on the waveform of a flash of light emitted from the flash lamp. For example, when a flash of light with a waveform having a relatively long wavelength is applied, the surface temperature of the semiconductor wafer rises for a relatively long time (however, in flash heating, the temperature rise time is 1 second or less at the longest). Conversely, when a flash of light having a short wavelength is applied, the surface temperature of the semiconductor wafer also rises rapidly.

In a case where the surface temperature of the semiconductor wafer rises for a relatively long time when a temperature profile is created by plotting a fixed number of data on the temperature of the semiconductor wafer measured with a radiation thermometer at a predetermined sampling interval, the temperature profile may be created only halfway through the temperature rise. Then, the maximum reaching temperature of the semiconductor wafer and the input amount of heat cannot be obtained from the temperature profile. On the other hand, when the surface temperature of the semiconductor wafer rises rapidly, the entire temperature rise can be included in the temperature profile, but the maximum reaching temperature of the semiconductor wafer may not be accurately determined.

In addition, in a case where the surface temperature of the semiconductor wafer gradually rises for a relatively long time when a temperature profile is created by plotting a fixed number of data on the temperature of the semiconductor wafer measured with a radiation thermometer at a predetermined sampling interval, it may not be possible to properly create a temperature profile from the start of irradiation with a flash of light.

Furthermore, in the heat treatment apparatus disclosed in Patent Document 1, the semiconductor wafer is preheated by light irradiation from a halogen lamp, and then a flash of light is applied from the flash lamp to the surface of the semiconductor wafer. When a temperature profile is created by plotting a fixed number of data on the temperature of the semiconductor wafer measured with a radiation thermometer at a predetermined sampling interval, it is conceivable to detect with a radiation thermometer the temperature rise of the semiconductor wafer at the moment of irradiation with a flash of light and to collect temperature data using it as a trigger. However, there has been a case where when the halogen lamp starts irradiating with light, the radiation thermometer erroneously detects the trigger and collects temperature data at the wrong timing, thereby making it impossible to create an appropriate temperature profile.

The present invention has been made in view of the above problems, and has an object to provide a heat treatment method and a heat treatment apparatus capable of appropriately creating a temperature profile.

Means to Solve the Problem

In order to solve the above problems, the first aspect of the present invention is a heat treatment method for irradiating a substrate with a flash of light to heat the substrate, the heat treatment method including: a flash of light irradiation step of irradiating a surface of a substrate with a flash of light from a flash lamp: a temperature measurement step of measuring a surface temperature of the substrate with a radiation thermometer in a preset data collection cycle; and a profile creation step of extracting, of a plurality of temperature data acquired in the temperature measurement step, a fixed number of temperature data before and after starting irradiation with the flash of light to create a temperature profile. The data collection cycle is made variable.

In addition, in the second aspect, in the heat treatment method according to the first aspect, the profile creation step includes: setting temperature data acquired a predetermined number of points before temperature data when a temperature measured by the radiation thermometer reaches a threshold value as starting point temperature data, and extracting the fixed number of temperature data at and after the starting point temperature data.

In addition, in the third aspect, the heat treatment method according to the first aspect further includes determining the data collection cycle according to a waveform of the flash of light applied in the flash of light irradiation step.

In addition, in the fourth aspect, the heat treatment method according to the third aspect further includes determining, based on a conversion table in which a waveform of a flash of light and a data collection cycle are associated with each other, the data collection cycle.

In addition, in the fifth aspect, the heat treatment method according to the fourth aspect further includes lengthening the data collection cycle as a waveform of the flash of light applied in the flash of light irradiation step becomes longer.

In addition, a sixth aspect is a heat treatment method for irradiating a substrate with a flash of light to heat the substrate, the heat treatment method including: a flash of light irradiation step of irradiating a surface of a substrate with a flash of light from a flash lamp: a temperature measurement step of measuring a surface temperature of the substrate with a radiation thermometer in a predetermined data collection cycle: a warning step of transmitting a warning signal before starting irradiation with the flash of light; and a profile creation step of, after transmitting the warning signal, setting temperature data acquired a predetermined number of points before temperature data when a temperature measured by the radiation thermometer reaches a threshold value as starting point temperature data, and extracting a fixed number of temperature data at and after the starting point temperature data from a plurality of temperature data acquired in the temperature measurement step to create a temperature profile.

In addition, in the seventh aspect, the heat treatment method according to the sixth aspect further includes a preheating step of, before the flash of light irradiation step, preheating the substrate with light irradiation from a continuously lit lamp. The warning signal is transmitted halfway through the preheating step.

In addition, in the eighth aspect, in the heat treatment method according to the sixth aspect, the threshold value is set lower than a maximum temperature reached by a surface of the substrate by irradiation with the flash of light.

In addition, a ninth aspect is a heat treatment method for irradiating a substrate with a flash of light to heat the substrate, the heat treatment method including: a flash of light irradiation step of irradiating a surface of a substrate with a flash of light from a flash lamp: a temperature measurement step of measuring a surface temperature of the substrate with a radiation thermometer in a predetermined data collection cycle; and a profile creation step of setting temperature data acquired a predetermined number of points before temperature data when inclination of a temperature measured by the radiation thermometer with respect to time is continuously not less than a threshold value for a certain period of time or more as starting point temperature data, and extracting a fixed number of temperature data at and after the starting point temperature data from a plurality of temperature data acquired in the temperature measurement step to create a temperature profile.

In addition, in the tenth aspect, the heat treatment method according to the ninth aspect further includes a warning step of transmitting a warning signal before starting irradiation with the flash of light. The profile creation step includes, after transmitting the warning signal, determining inclination of a temperature measured by the radiation thermometer with respect to time.

In addition, an eleventh aspect is a heat treatment apparatus configured to irradiate a substrate with a flash of light to heat the substrate, the heat treatment apparatus including: a chamber configured to house a substrate: a flash lamp configured to irradiate a surface of the substrate housed in the chamber with a flash of light: a radiation thermometer configured to receive infrared light radiated from a surface of the substrate and to measure a temperature of the surface in a preset data collection cycle; and a profile creation unit configured to extract, of a plurality of temperature data measured and acquired by the radiation thermometer, a fixed number of temperature data before and after the flash lamp starts irradiation with the flash of light to create a temperature profile. The data collection cycle is made variable.

In addition, in the twelfth aspect, in the heat treatment apparatus according to the eleventh aspect, the profile creation unit sets temperature data acquired a predetermined number of points before temperature data when a temperature measured by the radiation thermometer reaches a threshold value as starting point temperature data, and extracts the fixed number of temperature data at and after the starting point temperature data.

In addition, in the thirteenth aspect, the heat treatment apparatus according to the eleventh aspect further includes a cycle determination unit configured to determine the data collection cycle according to a waveform of the flash of light applied by the flash lamp.

In addition, in the fourteenth aspect, the heat treatment apparatus according to the thirteenth aspect further includes a storage unit configured to store a conversion table that associates a waveform of a flash of light with a data collection cycle. The cycle determination unit determines the data collection cycle based on the conversion table.

In addition, in the fifteenth aspect, in the heat treatment apparatus according to the fourteenth aspect, the cycle determination unit lengthens the data collection cycle as a waveform of the flash of light applied by the flash lamp becomes longer.

In addition, a sixteenth aspect is a heat treatment apparatus configured to irradiate a substrate with a flash of light to heat the substrate, the heat treatment apparatus including: a chamber configured to house a substrate; a flash lamp configured to irradiate a surface of the substrate housed in the chamber with a flash of light: a radiation thermometer configured to receive infrared light radiated from a surface of the substrate and to measure a temperature of the surface in a predetermined data collection cycle: a warning signal transmitting unit configured to transmit a warning signal before irradiation with the flash of light is started by the flash lamp; and a profile creation unit configured to, after the warning signal is transmitted, set temperature data acquired a predetermined number of points before temperature data when a temperature measured by the radiation thermometer reaches a threshold value as starting point temperature data, and to extract a fixed number of temperature data at and after the starting point temperature data from a plurality of temperature data measured and acquired by the radiation thermometer to create a temperature profile.

In addition, in the seventeenth aspect, the heat treatment apparatus according to the sixteenth aspect further includes a continuously lit lamp configured to irradiate the substrate with light before a flash of light is applied from the flash lamp and to perform preheating. The warning signal transmitting unit transmits the warning signal halfway through the preheating.

In addition, in the eighteenth aspect, in the heat treatment apparatus according to the sixteenth aspect, the threshold value is set lower than a maximum temperature reached by a surface of the substrate by the flash of light irradiation from the flash lamp.

In addition, a nineteenth aspect is a heat treatment apparatus configured to irradiate a substrate with a flash of light to heat the substrate, the heat treatment apparatus including: a chamber configured to house a substrate: a flash lamp configured to irradiate a surface of the substrate housed in the chamber with a flash of light: a radiation thermometer configured to receive infrared light radiated from a surface of the substrate and to measure a temperature of the surface in a predetermined data collection cycle; and a profile creation unit configured to set temperature data acquired a predetermined number of points before temperature data when inclination of a temperature measured by the radiation thermometer with respect to time is continuously not less than a threshold value for a certain period of time or more as starting point temperature data, and to extract a fixed number of temperature data at and after the starting point temperature data from a plurality of temperature data measured and acquired by the radiation thermometer to create a temperature profile.

In addition, in the twentieth aspect, the heat treatment apparatus according to the nineteenth aspect further includes a warning signal transmitting unit configured to transmit a warning signal before the flash lamp starts a flash of light irradiation. After the warning signal is transmitted, the profile creation unit determines inclination of a temperature measured by the radiation thermometer with respect to time.

Effects of the Invention

According to the heat treatment method according to the first to fifth aspects, since the data collection cycle of the radiation thermometer is made variable, the data collection cycle can be changed according to the temperature rise time of the substrate, and the temperature profile can be appropriately created regardless of the temperature rise time of the substrate.

In particular, according to the heat treatment method of the second aspect, since temperature data acquired a predetermined number of points before temperature data when a temperature measured by the radiation thermometer reaches a threshold value is set as starting point temperature data, and the fixed number of temperature data at and after the starting point temperature data is extracted, the temperature of the substrate at the time when a flash of light irradiation is started can be reliably included in the temperature profile.

In particular, according to the heat treatment method of the fifth aspect, since the data collection cycle is lengthened as a waveform of the flash of light becomes longer, even if the temperature rise time of the substrate is lengthened by a flash of light having a long waveform, the temperature change of the substrate can be included in the temperature profile.

According to the heat treatment method of the sixth to eighth aspects, since after a warning signal is transmitted before irradiation with the flash of light is started, temperature data acquired a predetermined number of points before temperature data when a temperature measured by the radiation thermometer reaches a threshold value is set as starting point temperature data, and a fixed number of temperature data at and after the starting point temperature data from a plurality of temperature data acquired in the temperature measurement step are extracted and a temperature profile is created, it is possible to prevent erroneous detection of the threshold value and create an appropriate temperature profile.

According to the heat treatment method of the ninth and tenth aspects, since temperature data acquired a predetermined number of points before temperature data when inclination of a temperature measured by the radiation thermometer with respect to time is continuously not less than a threshold value for a certain period of time or more is set as starting point temperature data, and a fixed number of temperature data at and after the starting point temperature data from a plurality of temperature data acquired in the temperature measurement step are extracted and a temperature profile is created, even when the surface temperature of the substrate is gradually raised by a flash of light irradiation, the temperature profile from the start of the flash of light irradiation can be appropriately created.

In particular, according to the heat treatment method of the tenth aspect, since after the warning signal is transmitted, inclination of a temperature measured by the radiation thermometer with respect to time is determined, it is possible to more reliably create a temperature profile from the start of a flash of light irradiation.

According to the heat treatment apparatus of the eleventh to fifteenth aspects, since the data collection cycle of the radiation thermometer is made variable, the data collection cycle can be changed according to the temperature rise time of the substrate, and the temperature profile can be appropriately created regardless of the temperature rise time of the substrate.

In particular, according to the heat treatment apparatus of the twelfth aspect, since temperature data acquired a predetermined number of points before temperature data when a temperature measured by the radiation thermometer reaches a threshold value is set as starting point temperature data, and the fixed number of temperature data at and after the starting point temperature data is extracted, the temperature of the substrate at the time when a flash of light irradiation is started can be reliably included in the temperature profile.

In particular, according to the heat treatment apparatus of the fifteenth aspect, since the data collection cycle is lengthened as a waveform of the flash of light becomes longer, even if the temperature rise time of the substrate is lengthened by a flash of light having a long waveform, the temperature change of the substrate can be included in the temperature profile.

According to the heat treatment apparatus of the sixteenth to eighteenth aspects, since after a warning signal is transmitted before irradiation with the flash of light is started, temperature data acquired a predetermined number of points before temperature data when a temperature measured by the radiation thermometer reaches a threshold value is set as starting point temperature data, and a fixed number of temperature data at and after the starting point temperature data from a plurality of temperature data measured and acquired by the radiation thermometer are extracted and a temperature profile is created, it is possible to prevent erroneous detection of the threshold value and create an appropriate temperature profile.

According to the heat treatment apparatus of the nineteenth and twentieth aspects, since temperature data acquired a predetermined number of points before temperature data when inclination of a temperature measured by the radiation thermometer with respect to time is continuously not less than a threshold value for a certain period of time or more is set as starting point temperature data, and a fixed number of temperature data at and after the starting point temperature data from a plurality of temperature data measured and acquired by the radiation thermometer are extracted and a temperature profile is created, even when the surface temperature of the substrate is gradually raised by a flash of light irradiation, the temperature profile from the start of the flash of light irradiation can be appropriately created.

In particular, according to the heat treatment apparatus of the twentieth aspect, since after the warning signal is transmitted, inclination of a temperature measured by the radiation thermometer with respect to time is determined, it is possible to more reliably create a temperature profile from the start of a flash of light irradiation.

DESCRIPTION OF EMBODIMENTS

Hereinafter, embodiments of the present invention will be described in detail with reference to the drawings.

First Embodiment

Figure 1:
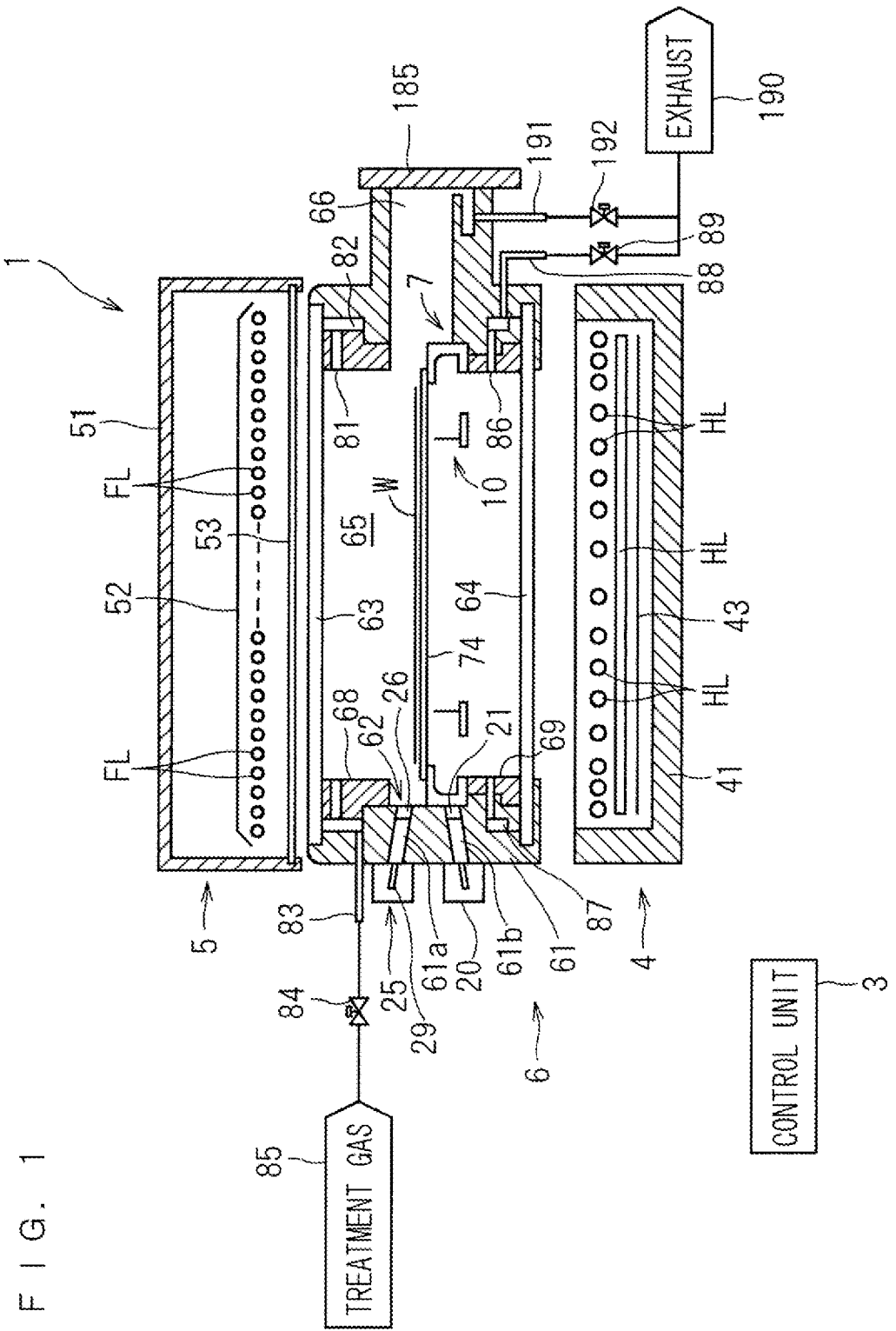
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 in FIG. 1 is a flash lamp annealing apparatus for irradiating a disc-shaped semiconductor wafer W as a substrate with a flash of light to heat the semiconductor wafer W. The size of the semiconductor wafer W to be treated is not particularly limited, and has a diameter of, for example, 300 mm or 450 mm (300 mm in the present embodiment). The semiconductor wafer W before being carried into the heat treatment apparatus 1 is implanted with impurities, and the activation treatment of impurities implanted by heating treatment with the heat treatment apparatus 1 is performed. It should be noted that the dimensions and the number of components are shown in exaggerated or simplified form as appropriate in FIG. 1 and the subsequent figures to facilitate understanding.

The heat treatment apparatus 1 includes a chamber 6 for housing a semiconductor wafer W, a flash heating unit 5 incorporating a plurality of flash lamps FL, and a halogen heating unit 4 incorporating a plurality of halogen lamps HL. The flash heating unit 5 is provided above the chamber 6, and the halogen heating unit 4 is provided below the chamber 6. In addition, the heat treatment apparatus 1 includes, inside the chamber 6, a holding unit 7 for holding a semiconductor wafer W in a horizontal attitude, and a transfer mechanism 10 for transferring a semiconductor wafer W between the holding unit 7 and the outside of the heat treatment apparatus 1. Furthermore, the heat treatment apparatus 1 includes a control unit 3 for controlling respective operating mechanisms provided in the halogen heating unit 4, the flash heating unit 5, and the chamber 6 to cause the operating mechanisms to perform heat treatment on a semiconductor wafer W.

The chamber 6 is configured by mounting quartz chamber windows above and below the tubular chamber side portion 61. The chamber side portion 61 has a substantially tubular shape with upper and lower openings, the upper side opening mounts an upper side chamber window 63 and is blocked, and the lower side opening mounts a lower side chamber window 64 and is blocked. The upper side chamber window 63 forming the ceiling portion of the chamber 6 is a disc-shaped member made of quartz, and serves as a quartz window that transmits a flash of light emitted from the flash heating unit 5 into the chamber 6. In addition, the lower side chamber window 64 forming the floor portion of the chamber 6 is also a disc-shaped member made of quartz, and serves as a quartz window that transmits light from the halogen heating unit 4 into the chamber 6.

In addition, a reflective ring 68 is mounted on an upper portion of the inner wall surface of the chamber side portion 61, and a reflective ring 69 is mounted on a lower portion thereof. Both reflective rings 68 and 69 are annularly formed. The upper side reflective ring 68 is mounted by being fitted from the upper side of the chamber side portion 61. On the other hand, the lower side reflective ring 69 is mounted by being fitted from the lower side of the chamber side portion 61 and is fastened with screws (not shown). That is, both reflective rings 68 and 69 are detachably mounted on the chamber side portion 61. An inner space of the chamber 6, that is, a space surrounded by the upper side chamber window 63, the lower side chamber window 64, the chamber side portion 61, and the reflective rings 68 and 69 is defined as a heat treatment space 65.

Mounting the reflective rings 68 and 69 on the chamber side portion 61 forms a recessed portion 62 on the inner wall surface of the chamber 6. That is, the recessed portion 62 is defined which is surrounded by a middle portion of the inner wall surface of the chamber side portion 61 where the reflective rings 68 and 69 are not mounted, a lower end surface of the reflective ring 68, and an upper end surface of the reflective ring 69. The recessed portion 62 is annularly formed along the horizontal direction on the inner wall surface of the chamber 6, and surrounds the holding unit 7 for holding a semiconductor wafer W. The chamber side portion 61 and the reflective rings 68 and 69 are made of a metal material excellent in strength and heat resistance (such as stainless steel).

In addition, the chamber side portion 61 is provided with a transport opening (throat) 66 for carrying a semiconductor wafer W into and out of the chamber 6. The transport opening 66 can be opened and closed by a gate valve 185. The transport opening 66 is connected in communication with an outer circumferential surface of the recessed portion 62. Therefore, when the gate valve 185 opens the transport opening 66, it is possible to carry a semiconductor wafer W from the transport opening 66 through the recessed portion 62 into the heat treatment space 65 and to carry a semiconductor wafer W out from the heat treatment space 65. In addition, when the gate valve 185 closes the transport opening 66, the heat treatment space 65 inside the chamber 6 becomes a hermetically sealed space.

Furthermore, a through hole 61*a* and a through hole 61*b* are drilled in the chamber side portion 61. The through hole 61*a* is a cylindrical hole for guiding the infrared light radiated from the upper surface of the semiconductor wafer W held by the susceptor 74 described below to the infrared sensor 29 of the upper radiation thermometer 25. On the other hand, the through hole 61*b* is a cylindrical hole for guiding the infrared light radiated from the lower surface of the semiconductor wafer W to the lower radiation thermometer 20. The through hole 61*a* and the through hole 61*b* are provided to be inclined with respect to the horizontal direction so that their axes in the through direction intersect with the main surface of the semiconductor wafer W held by the susceptor 74. A transparent window 26 made of a calcium fluoride material that transmits infrared light in a wavelength region measurable by the upper radiation thermometer 25 is attached to the end portion on the side facing the heat treatment space 65 of the through hole 61*a*. In addition, a transparent window 21 made of a barium fluoride material that transmits infrared light in a wavelength region measurable by the lower radiation thermometer 20 is attached to the end portion on the side facing the heat treatment space 65 of the through hole 61*b*.

In addition, the upper portion of the inner wall of the chamber 6 is provided with a gas supply hole 81 for supplying the treatment gas to the heat treatment space 65. The gas supply hole 81 is provided at a position above the recessed portion 62, and may be provided in the reflective ring 68. The gas supply hole 81 is connected in communication with the gas supply pipe 83 through a buffer space 82 annularly formed inside the side wall of the chamber 6. The gas supply pipe 83 is connected to the treatment gas supply source 85. In addition, a valve 84 is inserted halfway through the path of the gas supply pipe 83. When the valve 84 is opened, the treatment gas is supplied from the treatment gas supply source 85 to the buffer space 82. The treatment gas flowing in the buffer space 82 flows in a spreading manner within the buffer space 82 lower in fluid resistance than the gas supply hole 81, and is supplied from the gas supply hole 81 into the heat treatment space 65. As the treatment gas, for example, an inert gas such as nitrogen ($N_2$), a reactive gas such as hydrogen ($H_2$) or ammonia ($NH_3$), or a mixed gas in which they are mixed can be used (nitrogen gas in the present embodiment).

On the other hand, a gas exhaust hole 86 for exhausting the gas in the heat treatment space 65 is provided in the lower portion of the inner wall of the chamber 6. The gas exhaust hole 86 is provided at a position below the recessed portion 62, and may be provided in the reflective ring 69. The gas exhaust hole 86 is connected in communication with a gas exhaust pipe 88 through a buffer space 87 annularly formed inside the side wall of the chamber 6. The gas exhaust pipe 88 is connected to an exhaust unit 190. In addition, a valve 89 is inserted halfway through the path of the gas exhaust pipe 88. When the valve 89 is opened, the gas in the heat treatment space 65 is discharged from the gas exhaust opening 86 through the buffer space 87 to the gas exhaust pipe 88. It should be noted that a plurality of gas supply holes 81 and gas exhaust holes 86 may be provided along the circumferential direction of the chamber 6, or may be slit-shaped. In addition, the treatment gas supply source 85 and the exhaust unit 190 may be mechanisms provided in the heat treatment apparatus 1, or may be utilities of a factory in which the heat treatment apparatus 1 is installed.

In addition, a gas exhaust pipe 191 for discharging the gas in the heat treatment space 65 is also connected to the tip of the transport opening 66. The gas exhaust pipe 191 is connected to the exhaust unit 190 via a valve 192. Opening the valve 192 exhausts the gas in the chamber 6 through the transport opening 66.

Figure 2:
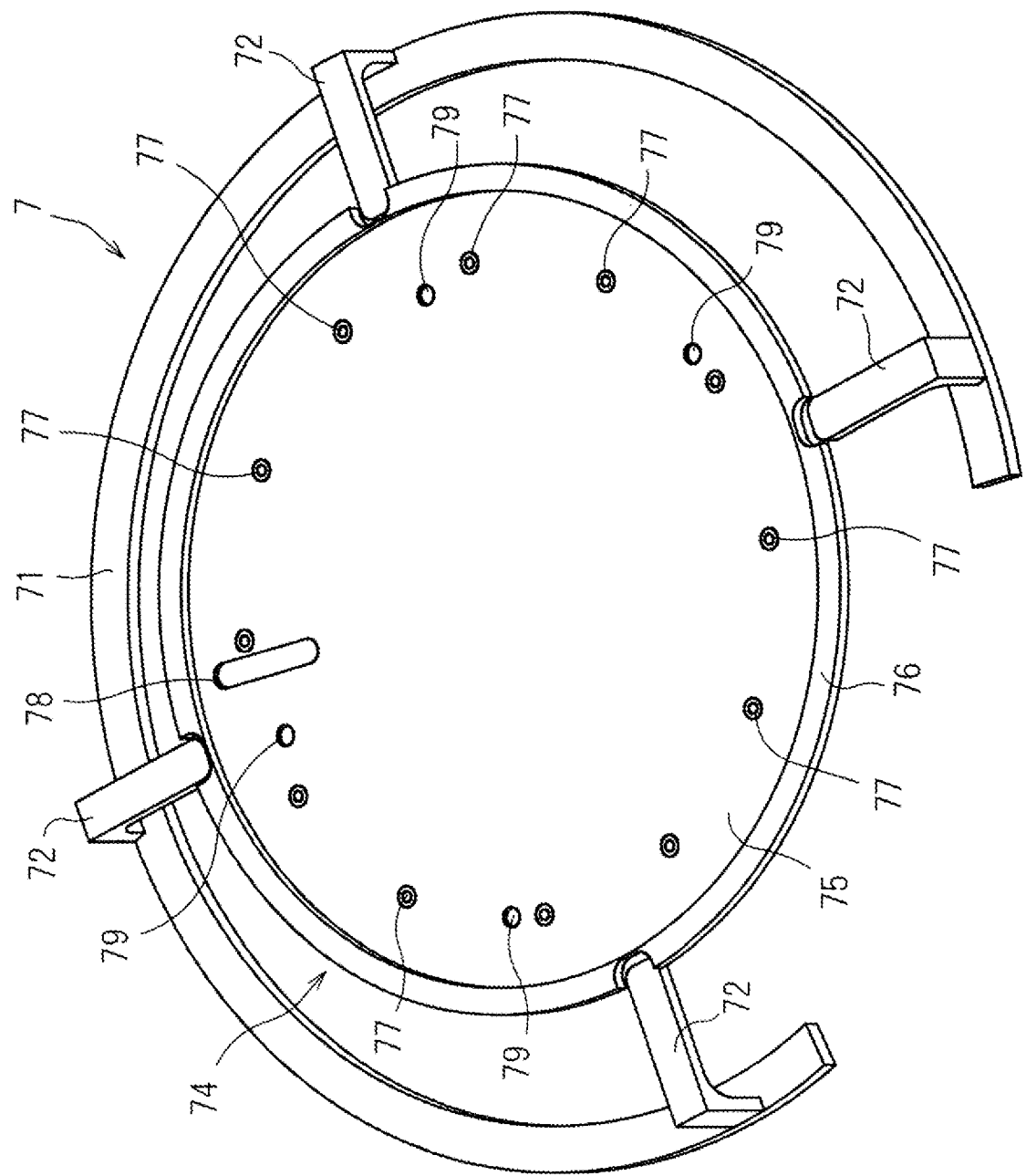
FIG. 2 is a perspective view showing the overall appearance of a holding unit.

FIG. 2 is a perspective view showing the overall appearance of the holding unit 7. The holding unit 7 includes a base ring 71, coupling portions 72, and the susceptor 74. The base ring 71, the coupling portion 72, and the susceptor 74 are all made of quartz. That is, the entire holding unit 7 is made of quartz.

The base ring 71 is an arc-shaped quartz member in which a part is missing from the annular shape. This missing portion is provided to prevent interference between the transfer arm 11 of the transfer mechanism 10 described below and the base ring 71. Placing the base ring 71 on the bottom surface of the recessed portion 62 causes the base ring 71 to be supported on the wall surface of the chamber 6 (see FIG. 1). On the upper surface of the base ring 71, a plurality of coupling portions 72 (four in the present embodiment) are erected along the circumferential direction of the annular shape thereof. The coupling portion 72 is also a quartz member, and is fixed to the base ring 71 by welding.

Figure 3:
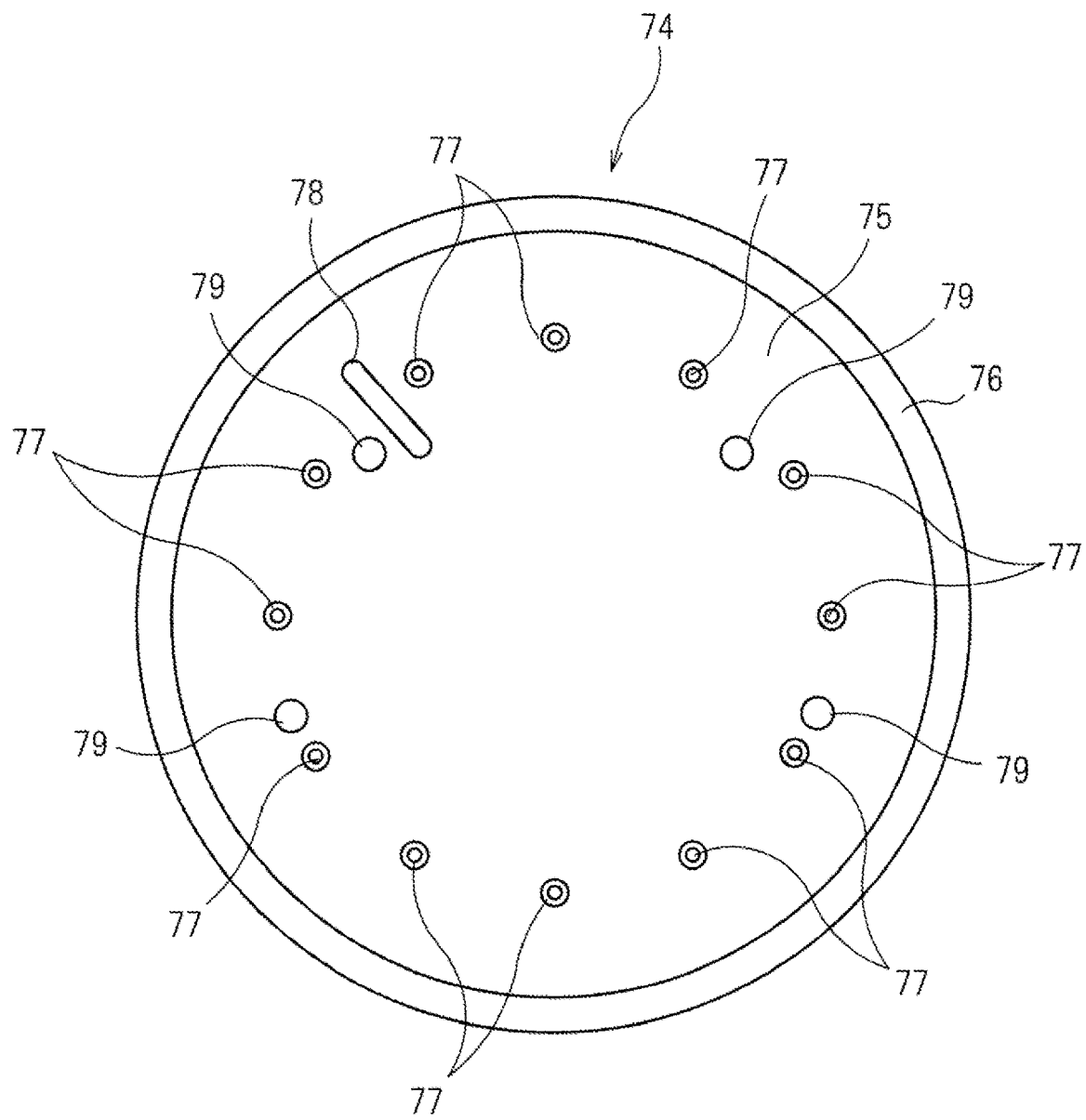
FIG. 3 is a plan view of a susceptor.
Figure 4:
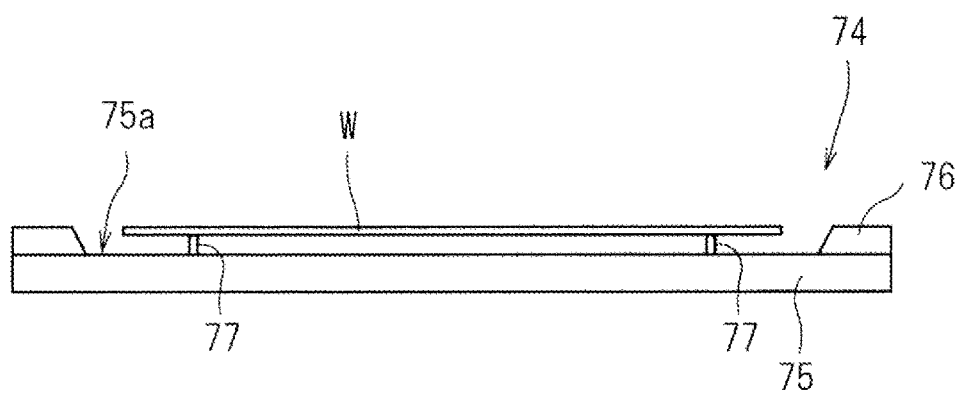
FIG. 4 is a cross-sectional view of the susceptor.

The susceptor 74 is supported by the four coupling portions 72 provided on the base ring 71. FIG. 3 is a plan view of the susceptor 74. In addition, FIG. 4 is a cross-sectional view of the susceptor 74. The susceptor 74 includes a holding plate 75, a guide ring 76, and a plurality of substrate support pins 77. The holding plate 75 is a substantially circular flat plate member made of quartz. The diameter of the holding plate 75 is greater than that of a semiconductor wafer W. That is, the holding plate 75 has a larger planar size than the semiconductor wafer W.

A guide ring 76 is installed on the upper surface circumferential edge portion of the holding plate 75. The guide ring 76 is an annular-shaped member having an inner diameter larger than the diameter of the semiconductor wafer W. For example, when the diameter of the semiconductor wafer W is 300 mm, the inner diameter of the guide ring 76 is 320 mm. The inner circumference of the guide ring 76 is a tapered surface so as to widen upward from the holding plate 75. The guide ring 76 is made of quartz similar to the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

On the upper surface of the holding plate 75, the region inside the guide ring 76 serves as a flat holding surface 75a for holding the semiconductor wafer W. A plurality of substrate support pins 77 are erected on the holding surface 75a of the holding plate 75. In the present embodiment, a total of twelve substrate support pins 77 are erected at every 30° along the circumference of the circle concentric with the outer circumference circle (inner circumference circle of the guide ring 76) of the holding surface 75a. The diameter of the circle in which the twelve substrate support pins 77 are arranged (distance between the opposing substrate support pins 77) is smaller than the diameter of the semiconductor wafer W, and is 270 mm to 280 mm (270 mm in the present embodiment) when the diameter of the semiconductor wafer W is 300 mm. Each of the substrate support pins 77 is made of quartz. The plurality of substrate support pins 77 may be provided on the upper surface of the holding plate 75 by welding, or may be machined integrally with the holding plate 75.

Returning to FIG. 2, the four coupling portions 72 erected on the base ring 71 and the circumferential edge portion of the holding plate 75 of the susceptor 74 are fixed by welding. That is, the susceptor 74 and the base ring 71 are fixedly coupled by the coupling portion 72. The base ring 71 of the holding portion 7 is supported on the wall surface of the chamber 6, whereby the holding portion 7 is mounted on the chamber 6. In a state where the holding portion 7 is mounted on the chamber 6, the holding plate 75 of the susceptor 74 is in a horizontal attitude (attitude in which the normal line coincides with the vertical direction). That is, the holding surface 75a of the holding plate 75 is a horizontal plane.

The semiconductor wafer W carried into the chamber 6 is placed and held in a horizontal attitude on the susceptor 74 of the holding portion 7 mounted on the chamber 6. At this time, the semiconductor wafer W is supported by the twelve substrate support pins 77 erected on the holding plate 75 and is held by the susceptor 74. More precisely, the upper end portions of the twelve substrate support pins 77 come into contact with the lower surface of the semiconductor wafer W to support the semiconductor wafer W. Since the heights of the twelve substrate support pins 77 (distances from the upper ends of the substrate support pins 77 to the holding surface 75a of the holding plate 75) are uniform, the semiconductor wafer W can be supported in a horizontal attitude by the twelve substrate support pins 77.

In addition, the semiconductor wafer W is supported by a plurality of substrate support pins 77 at a predetermined distance from the holding surface 75a of the holding plate 75. The thickness of the guide ring 76 is larger than the height of the substrate support pin 77. Therefore, the horizontal positional deviation of the semiconductor wafer W supported by the plurality of substrate support pins 77 is prevented by the guide ring 76.

In addition, as shown in FIGS. 2 and 3, in the holding plate 75 of the susceptor 74, an opening 78 vertically penetrating is formed. The opening 78 is provided in order for the lower radiation thermometer 20 to receive the radiation light (infrared light) radiated from the lower surface of the semiconductor wafer W. That is, the lower radiation thermometer 20 receives the light radiated from the lower surface of the semiconductor wafer W through the opening 78 and the transparent window 21 mounted on the through hole 61b of the chamber side portion 61, and measures the temperature of the semiconductor wafer W. Furthermore, in the holding plate 75 of the susceptor 74, four through holes 79 through which the lift pins 12 of the transfer mechanism 10 described below pass are drilled for the transfer of the semiconductor wafer W.

Figure 5:
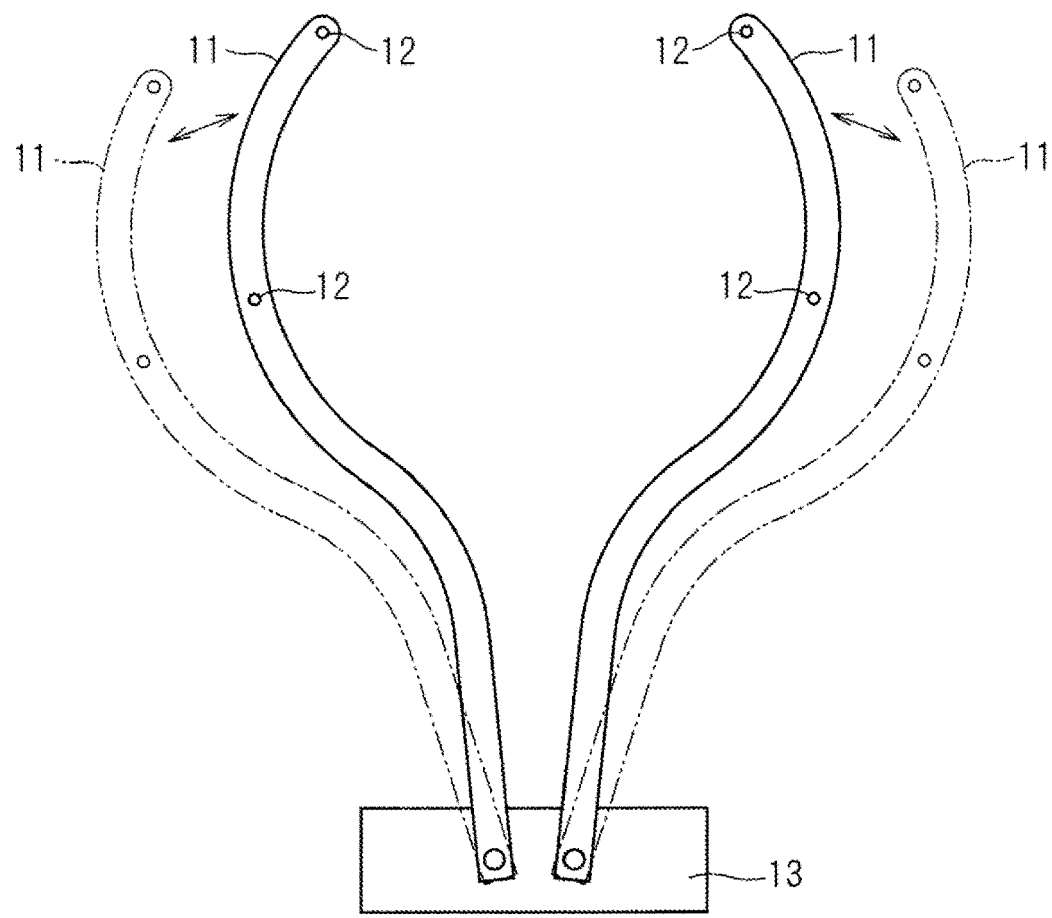
FIG. 5 is a plan view of a transfer mechanism.
Figure 6:
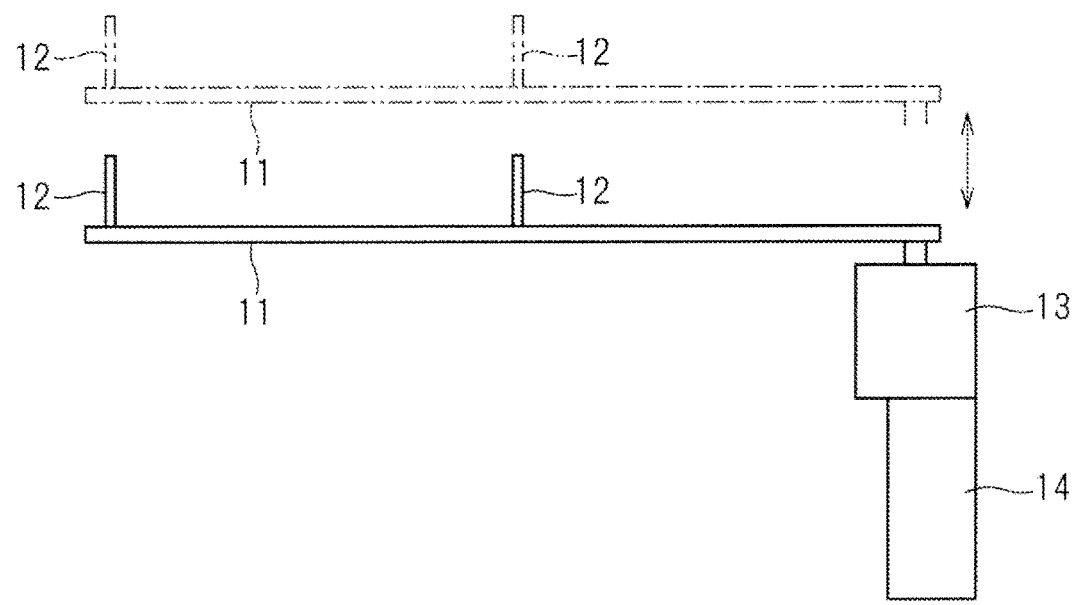
FIG. 6 is a side view of the transfer mechanism.

FIG. 5 is a plan view of the transfer mechanism 10. In addition, FIG. 6 is a side view of the transfer mechanism 10. The transfer mechanism 10 includes two transfer arms 11. The transfer arm 11 has an arc shape that approximately follows the annular recessed portion 62. Two lift pins 12 are erected on each transfer arm 11. The transfer arm 11 and the lift pin 12 are made of quartz. Each transfer arm 11 is pivotable by a horizontal movement mechanism 13. The horizontal movement mechanism 13 horizontally moves a pair of transfer arms 11 between the transfer operation position (solid line position in FIG. 5) that transfers the semiconductor wafer W with respect to the holding portion 7 and the retracted position (two-dot chain line position in FIG. 5) that does not overlap with the semiconductor wafer W held by the holding portion 7 in a plan view. The horizontal movement mechanism 13 may be a mechanism that causes separate motors to rotate the respective transfer arms 11, or may be a mechanism that causes a single motor to rotate the pair of transfer arms 11 in an interlocked manner using a link mechanism.

In addition, the pair of transfer arms 11 are moved up and down together with the horizontal movement mechanism 13 by the elevating mechanism 14. When the elevating mechanism 14 raises the pair of transfer arms 11 at the transfer operation position, a total of four lift pins 12 pass through the through holes 79 (see FIGS. 2 and 3) drilled in the susceptor 74, and the upper end of the lift pin 12 protrudes from the upper surface of the susceptor 74. On the other hand, when the elevating mechanism 14 lowers the pair of transfer arms 11 at the transfer operation position to pull out the lift pins 12 from the through holes 79, and the horizontal movement mechanism 13 moves the pair of transfer arms 11 so as to open the pair of transfer arms 11, each transfer arm 11 moves to the retracted position. The retracted position of the pair of transfer arms 11 is directly above the base ring 71 of the holding portion 7. Since the base ring 71 is placed on the bottom surface of the recessed portion 62, the retracted position of the transfer arm 11 is inside the recessed portion 62. It should be noted that an exhaust mechanism (not shown) is also provided near the portion where the drive unit (horizontal movement mechanism 13 and elevating mechanism 14) of the transfer mechanism 10 is provided, and is configured to discharge the atmosphere around the drive unit of the transfer mechanism 10 to the outside of the chamber 6.

Returning to FIG. 1, the flash heating unit 5 provided above the chamber 6 is configured to include a light source including a plurality of (30 in the present embodiment) xenon flash lamps FL inside the housing 51 and a reflector 52 provided to cover above the light source. In addition, a lamp light radiation window 53 is mounted on the bottom portion of the housing 51 of the flash heating unit 5. The lamp light radiation window 53 constituting the floor portion of the flash heating unit 5 is a plate-shaped quartz window made of quartz. Installing the flash heating unit 5 above the chamber 6 causes the lamp light radiation window 53 and the upper side chamber window 63 to face each other. The flash lamps FL apply a flash of light from above the chamber 6 through the lamp light radiation window 53 and the upper side chamber window 63 to the heat treatment space 65.

The plurality of flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holding unit 7 (that is, along a horizontal direction). Therefore, the plane formed by the arrangement of the flash lamps FL is also a horizontal plane.

Figure 8:
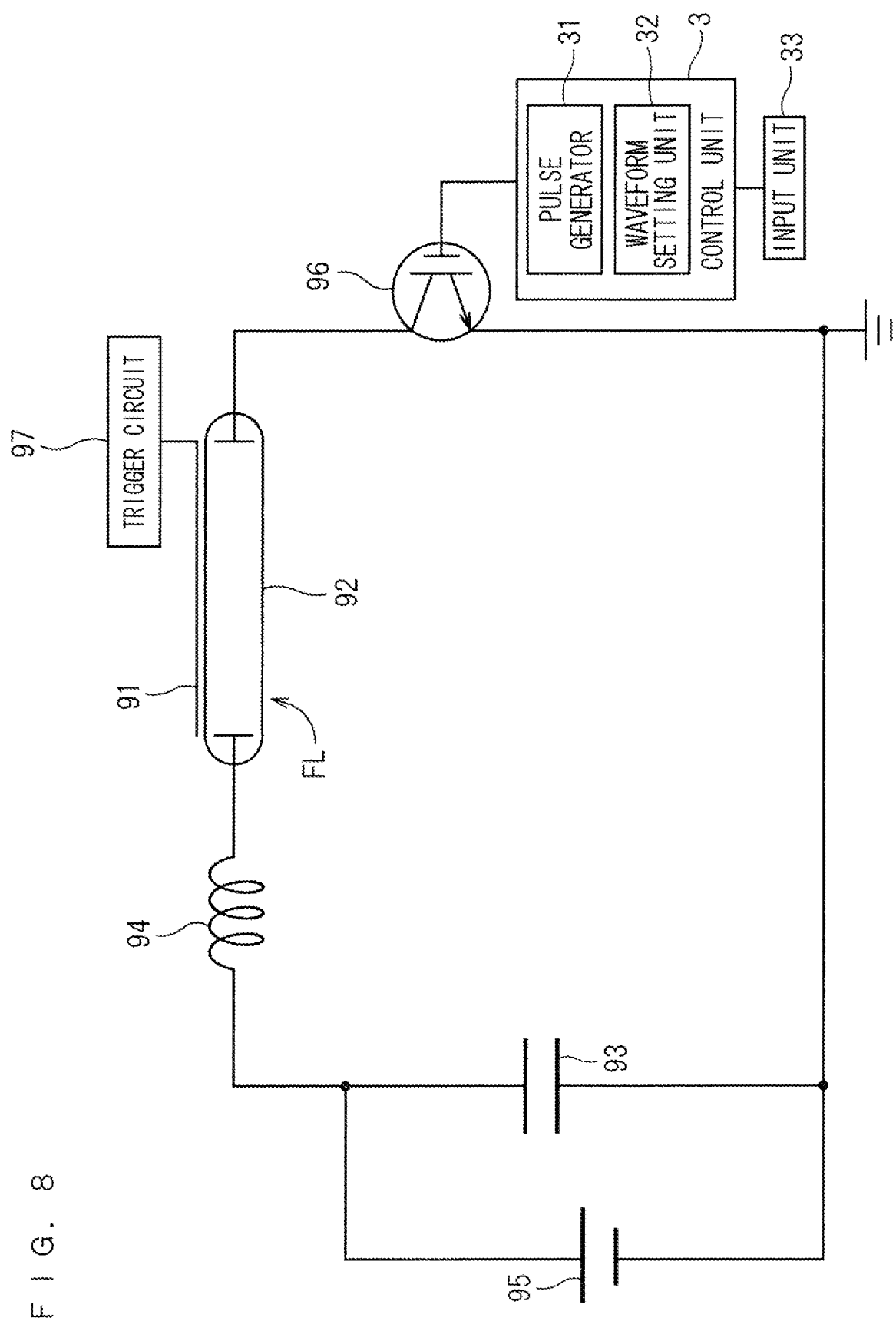
FIG. 8 is a diagram showing a drive circuit of a flash lamp.

FIG. 8 is a diagram showing a drive circuit of the flash lamp FL. As shown in the figure, a capacitor 93, a coil 94, a flash lamp FL, and an insulated gate bipolar transistor (IGBT) 96 are connected in series. In addition, as shown in FIG. 8, the control unit 3 includes a pulse generator 31 and a waveform setting unit 32, and is connected to the input unit 33. As the input unit 33, various known input apparatuses such as a keyboard, a mouse, and a touch panel can be adopted. The waveform setting unit 32 sets the waveform of the pulse signal based on the input content from the input unit 33, and the pulse generator 31 generates the pulse signal according to the waveform.

The flash lamp FL includes a rod-shaped glass tube (discharge tube) 92 in which xenon gas is sealed inside and an anode and a cathode are arranged at both ends thereof, and a trigger electrode 91 attached on the outer circumferential surface of the glass tube 92. The capacitor 93 is applied with a predetermined voltage by the power supply unit 95, and is charged with an electric charge corresponding to the applied voltage (charging voltage). In addition, the trigger electrode 91 can be applied with a high voltage from the trigger circuit 97. The timing at which the trigger circuit 97 applies a voltage to the trigger electrode 91 is controlled by the control unit 3.

The IGBT 96 is a bipolar transistor in which a metal oxide semiconductor field effect transistor (MOSFET) is incorporated in the gate portion, and is a switching element suitable for handling a large amount of electric power. The gate of the IGBT 96 is applied with a pulse signal from the pulse generator 31 of the control unit 3. When a voltage not less than a predetermined value (High voltage) is applied to the gate of the IGBT 96, the IGBT 96 comes into an ON state, and when a voltage less than the predetermined value (Low voltage) is applied, the IGBT 96 comes into an OFF state. In this way, the drive circuit including the flash lamp FL is turned on and off by the IGBT 96. Turning the IGBT 96 on and off intermittently connects between the flash lamp FL and the corresponding capacitor 93, and controls on and off the current flowing through the flash lamp FL.

Even if, with the capacitor 93 being charged, the IGBT 96 comes into an ON state and a high voltage is applied across the electrodes at both ends of the glass tube 92, the xenon gas is electrically an insulator, so that electricity does not flow in the glass tube 92 under normal conditions. However, when the trigger circuit 97 applies a high voltage to the trigger electrode 91 to break the insulation, a current flows instantly in the glass tube 92 due to the discharge between the electrodes at both ends, and light is emitted by the excitation of xenon atoms or molecules at that time.

The drive circuit as shown in FIG. 8 is individually provided for each of the plurality of flash lamps FL provided in the flash heating unit 5. In the present embodiment, since thirty flash lamps FL are arranged in a plane, thirty drive circuits, each as shown in FIG. 8, are provided corresponding to them. Therefore, the current flowing through each of the thirty flash lamps FL is individually on-off controlled by the corresponding IGBT 96.

In addition, the reflector 52 is provided above the plurality of flash lamps FL so as to cover all of them. The basic function of the reflector 52 is to reflect the flashes of light emitted from the plurality of flash lamps FL toward the heat treatment space 65. The reflector 52 is made of an aluminum alloy plate, and its front surface (the surface on the side facing the flash lamps FL) is roughened by blasting.

The halogen heating unit 4 provided below the chamber 6 incorporates a plurality of halogen lamps HL (forty in the present embodiment) inside the housing 41. The halogen heating unit 4 is a light irradiation unit that heats the semiconductor wafer W by applying light from below the chamber 6 through the lower side chamber window 64 to the heat treatment space 65 with a plurality of halogen lamps HL.

Figure 7:
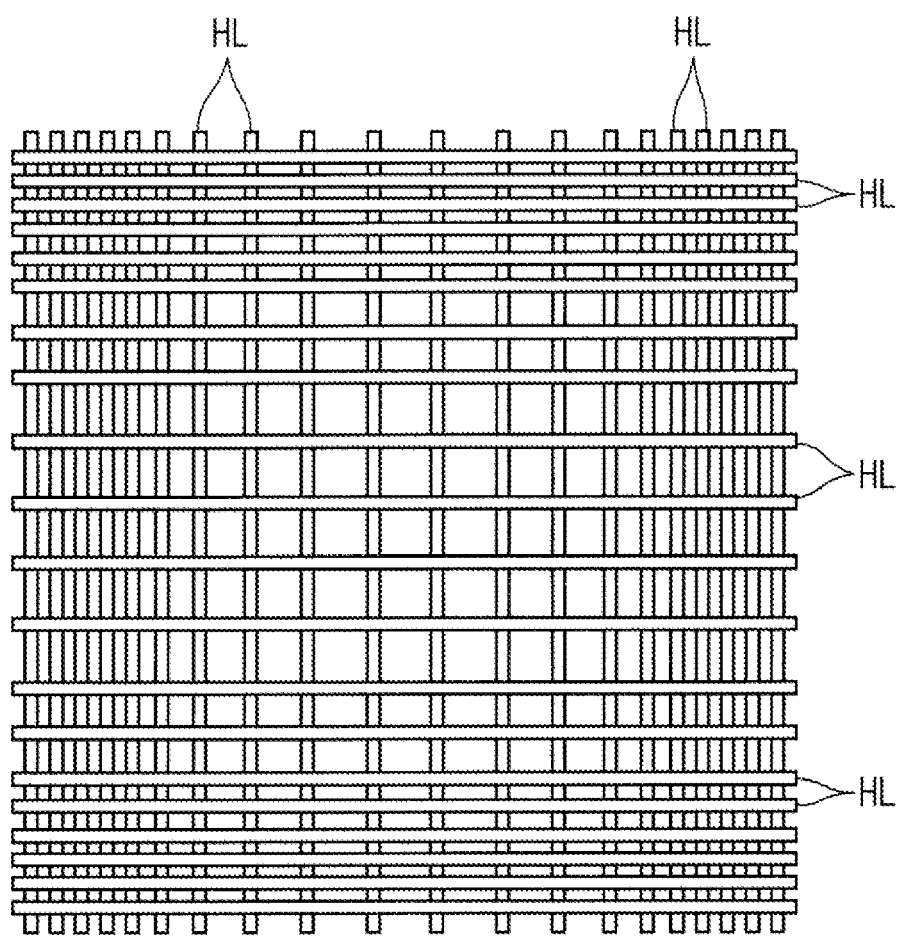
FIG. 7 is a plan view showing an arrangement of a plurality of halogen lamps.

FIG. 7 is a plan view showing an arrangement of the plurality of halogen lamps HL. The forty halogen lamps HL are arranged to be divided in two stages of upper and lower stages. Twenty halogen lamps HL are arranged in the upper stage near the holding unit 7, and twenty halogen lamps HL are arranged also in the lower stage farther from the holding portion 7 than the upper stage. Each halogen lamp HL is a rod-shaped lamp having a long cylindrical shape. The twenty halogen lamps HL in both the upper and lower stages are arranged so that the respective longitudinal directions are parallel to each other along the main surface of the semiconductor wafer W held by the holding portion 7 (that is, along the horizontal direction). Therefore, the plane formed by the arrangement of the halogen lamps HL in both the upper and lower stages is a horizontal plane.

In addition, as shown in FIG. 7, in both the upper and lower stages, the arrangement density of the halogen lamps HL in the region facing the circumferential edge portion is higher than that in the region facing the central portion of the semiconductor wafer W held by the holding portion 7. That is, in both the upper and lower stages, the arrangement pitch of the halogen lamps HL is shorter in the circumferential edge portion than in the central portion of the lamp arrangement. Therefore, it is possible to apply a larger amount of light to the circumferential edge portion of the semiconductor wafer W likely to have a temperature drop during heating by light irradiation from the halogen heating unit 4.

In addition, the lamp group including the halogen lamps HL in the upper stage and the lamp group including the halogen lamps HL in the lower stage are arranged to intersect in a grid pattern. That is, a total of forty halogen lamps HL are arranged so that the longitudinal direction of the 20 halogen lamps HL arranged in the upper stage and the longitudinal direction of the 20 halogen lamps HL arranged in the lower stage are orthogonal to each other.

The halogen lamp HL is a filament type light source that incandesces the filament and emits light by energizing the filament arranged inside the glass tube. Inside the glass tube, a gas in which a minute amount of a halogen element (iodine, bromine, or the like) is introduced into an inert gas such as nitrogen or argon is sealed. Introducing the halogen element makes it possible to set the temperature of the filament to a high temperature while suppressing the breakage of the filament. Therefore, the halogen lamp HL has a characteristic that it has a longer life and can continuously apply strong light as compared with a normal incandescent lamp. That is, the halogen lamp HL is a continuously lit lamp that continuously emits light for at least 1 second or longer. In addition, since the halogen lamp HL is a rod-shaped lamp, it has a long life, and arranging the halogen lamp HL along the horizontal direction causes the radiation efficiency to the semiconductor wafer W arranged above to become excellent.

In addition, also inside the housing 41 of the halogen heating unit 4, a reflector 43 is provided on the lower side of the two-stage halogen lamps HL (FIG. 1). The reflector 43 reflects the light emitted from the plurality of halogen lamps HL toward the heat treatment space 65.

The control unit 3 controls the above-described various operating mechanisms provided in the heat treatment apparatus 1. The configuration of the control unit 3 as hardware is the same as that of a general computer. That is, the control unit 3 includes a CPU being a circuit that performs various types of arithmetic processing, a ROM being a read-only memory that stores basic programs, a RAM being a memory capable of reading and writing that stores various types of information, and a magnetic disk that stores control software, data, and the like. The CPU of the control unit 3 executes a predetermined processing program, whereby the processing in the heat treatment apparatus 1 proceeds. In addition, the control unit 3 includes a pulse generator 31 and a waveform setting unit 32 (FIG. 8). The waveform setting unit 32 sets the waveform of a pulse signal based on the input contents from the input unit 33, and the pulse generator 31 outputs the pulse signal to the gate of the IGBT 96 accordingly.

In addition, as shown in FIG. 1, the heat treatment apparatus 1 includes an upper radiation thermometer 25 and a lower radiation thermometer 20. The upper radiation thermometer 25 is a high-speed radiation thermometer for measuring a rapid temperature change on the upper surface of the semiconductor wafer W when a flash of light is applied from the flash lamp FL.

Figure 9:
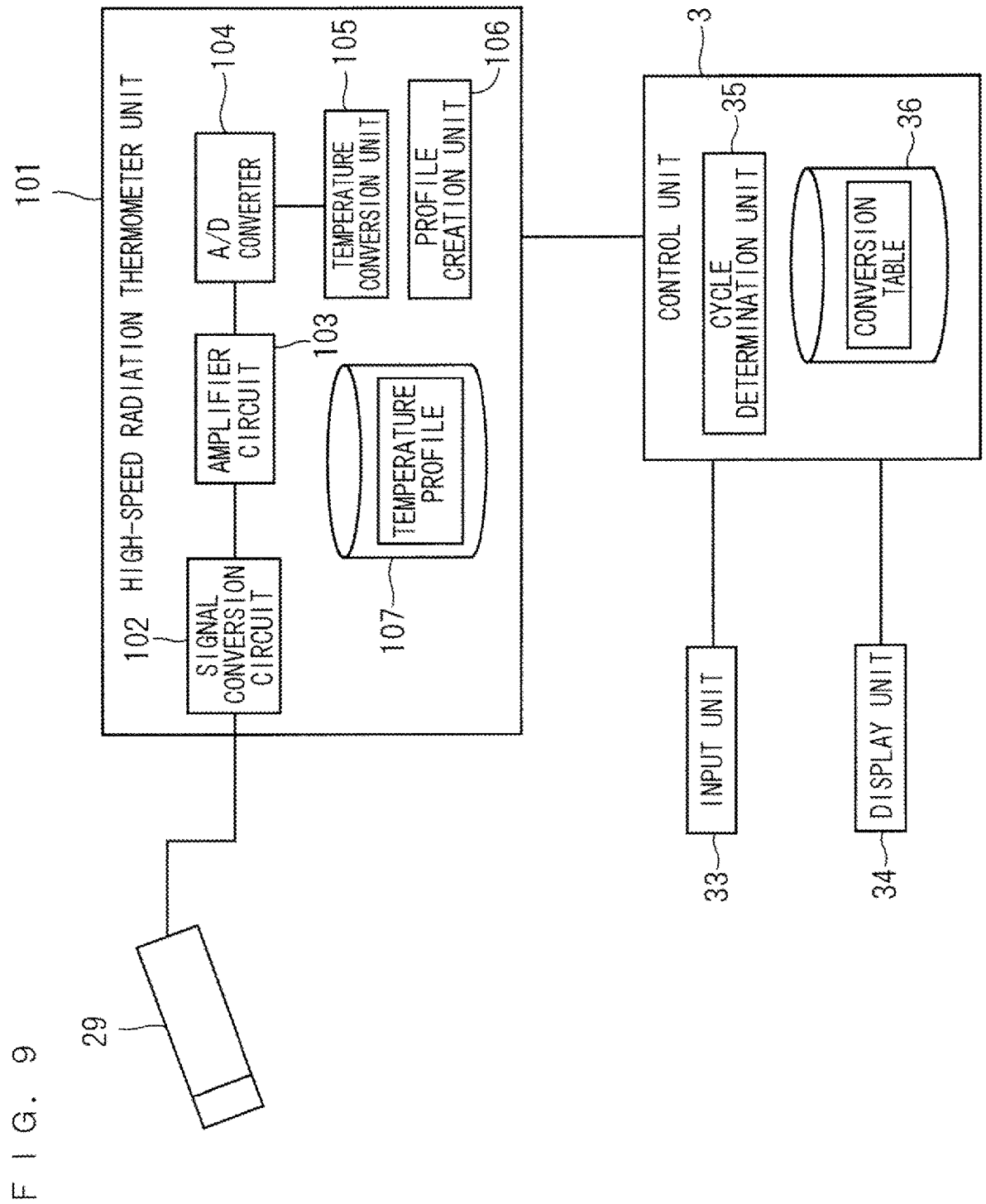
FIG. 9 is a block diagram showing a configuration of a high-speed radiation thermometer unit including a main part of an upper radiation thermometer.

FIG. 9 is a block diagram showing a configuration of a high-speed radiation thermometer unit 101 including a main part of the upper radiation thermometer 25. The infrared sensor 29 of the upper radiation thermometer 25 is mounted on the outer wall surface of the chamber side portion 61 so that its optical axis coincides with the axis in the penetrating direction of the through hole 61a. The infrared sensor 29 receives infrared light radiated from the upper surface of the semiconductor wafer W held by the susceptor 74 through the transparent window 26 made of calcium fluoride. The infrared sensor 29 includes an InSb (indium antimonide) optical element, and its measurement wavelength range is 5 μm to 6.5 μm. The transparent window 26 made of calcium fluoride selectively transmits infrared light in the measurement wavelength range of the infrared sensor 29. The InSb optical element changes in resistance according to the intensity of the infrared light received. The infrared sensor 29 including the InSb optical element is capable of high-speed measurement with an extremely short response time and a significantly short sampling interval (a minimum of about 20 microseconds). The infrared sensor 29 is electrically connected to the high-speed radiation thermometer unit 101, and transmits a signal generated in response to light reception to the high-speed radiation thermometer unit 101.

The high-speed radiation thermometer unit 101 includes a signal conversion circuit 102, an amplifier circuit 103, an A/D converter 104, a temperature conversion unit 105, a profile creation unit 106, and a storage unit 107. The signal conversion circuit 102 is a circuit that signal-converts the resistance change generated by the InSb optical element of the infrared sensor 29 into the current change and voltage change in the order thereof, and finally into a voltage signal easy to handle and outputs the result. The signal conversion circuit 102 is configured using an operational amplifier, for example. The amplifier circuit 103 amplifies the voltage signal output from the signal conversion circuit 102 and outputs the result to the A/D converter 104. The A/D converter 104 converts the voltage signal amplified by the amplifier circuit 103 into a digital signal.

The temperature conversion unit 105 and the profile creation unit 106 are functional processing units achieved by the CPU (not shown) of the high-speed radiation thermometer unit 101 executing a predetermined processing program. The temperature conversion unit 105 performs predetermined arithmetic processing on the signal output from the A/D converter 104, that is, the signal indicating the intensity of the infrared light received by the infrared sensor 29 and converts the result into temperature. The temperature obtained by the temperature conversion unit 105 is the temperature of the upper surface of the semiconductor wafer W. It should be noted that the upper radiation thermometer 25 includes an infrared sensor 29, a signal conversion circuit 102, an amplifier circuit 103, an A/D converter 104, and a temperature conversion unit 105. The lower radiation thermometer 20 has roughly the same configuration as the upper radiation thermometer 25, but does not have to support high-speed measurement.

In addition, the profile creation unit 106 creates a temperature profile indicating the time change of the temperature on the upper surface of the semiconductor wafer W by sequentially accumulating in the storage unit 107 the temperature data acquired at regular intervals by the temperature conversion unit 105. As the storage unit 107, a known storage medium such as a magnetic disk or a memory can be used. It should be noted that the creation of the temperature profile will be described in more detail below.

As shown in FIG. 9, the high-speed radiation thermometer unit 101 is electrically connected to the control unit 3 being the controller of the entire heat treatment apparatus 1. The control unit 3 includes a cycle determination unit 35 in addition to the pulse generator 31 and the waveform setting unit 32 (not shown in FIG. 9). The cycle determination unit 35 is a functional processing unit achieved by the CPU of the control unit 3 executing a predetermined processing program. The processing contents of the cycle determination unit 35 will also be further described below.

In addition, a display unit 34 and the input unit 33 are connected to the control unit 3. The control unit 3 displays various pieces of information on the display unit 34. The operator of the heat treatment apparatus 1 can input various commands and parameters from the input unit 33 while checking the information displayed on the display unit 34. As the display unit 34 and the input unit 33, for example, a liquid crystal touch panel provided on the outer wall of the heat treatment apparatus 1 may be adopted. It should be noted that the storage unit 36 shown in FIG. 9 is a storage medium such as a magnetic disk or a memory of the control unit 3.

In addition to the above configuration, the heat treatment apparatus 1 has various cooling structures in order to prevent excessive temperature rise of the halogen heating unit 4, the flash heating unit 5, and the chamber 6 due to the thermal energy generated from the halogen lamps HL and the flash lamps FL during the heat treatment of the semiconductor wafer W. For example, a water cooling pipe (not shown) is provided on the wall of the chamber 6. In addition, the halogen heating unit 4 and the flash heating unit 5 have an air-cooled structure for forming a gas flow inside to exhaust heat. In addition, air is also supplied to the gap between the upper side chamber window 63 and the lamp light radiation window 53 to cool the flash heating unit 5 and the upper side chamber window 63.

Next, the processing operation in the heat treatment apparatus 1 will be described. First, a typical heat treatment procedure for the semiconductor wafer W to be treated will be described. In this case, the semiconductor wafer W to be treated is a semiconductor substrate to which impurities (ions) have been added by the ion implantation method. Activation of the impurities is performed by a flash of light irradiation heating treatment (annealing) by the heat treatment apparatus 1. The treatment procedure of the heat treatment apparatus 1 described below proceeds by the control of the control unit 3 over each operation mechanism of the heat treatment apparatus 1.

First, the valve 84 for air supply is opened, and the valves 89 and 192 for exhaust are opened to start air supply to and exhaust from the inside of the chamber 6. When the valve 84 is opened, nitrogen gas is supplied to the heat treatment space 65 from the gas supply hole 81. In addition, when the valve 89 is opened, the gas in the chamber 6 is exhausted from the gas exhaust hole 86. Thus, the nitrogen gas supplied from the upper portion of the heat treatment space 65 in the chamber 6 flows downward and is exhausted from the lower portion of the heat treatment space 65.

In addition, opening the valve 192 exhausts the gas in the chamber 6 from also the transport opening 66. Furthermore, an exhaust mechanism (not shown) exhausts also the atmosphere around the drive unit of the transfer mechanism 10. It should be noted that during the heat treatment of the semiconductor wafer W in the heat treatment apparatus 1, nitrogen gas is continuously supplied to the heat treatment space 65, and the supply amount is appropriately changed according to the treatment step.

Subsequently, the gate valve 185 is opened and the transfer opening 66 is opened, and the transfer robot outside the apparatus carries the semiconductor wafer W to be treated into the heat treatment space 65 in the chamber 6 through the transfer opening 66. At this time, the atmosphere outside the apparatus may be sucked as the semiconductor wafer W is carried in, but since nitrogen gas continues to be supplied to the chamber 6, nitrogen gas flows out from the transport opening 66, and suction of such an external atmosphere can be minimized.

The semiconductor wafer W carried in by the transfer robot advances to a position directly above the holding portion 7 and stops. Then, the pair of transfer arms 11 of the transfer mechanism 10 move horizontally from the retracted position to the transfer operation position and rise, whereby the lift pins 12 protrude from the upper surface of the holding plate 75 of the susceptor 74 through the through holes 79 and receive the semiconductor wafer W. At this time, the lift pin 12 rises above the upper end of the substrate support pin 77.

After the semiconductor wafer W is placed on the lift pin 12, the transfer robot exits the heat treatment space 65, and the transfer opening 66 is closed by the gate valve 185. Then, as the pair of transfer arms 11 descend, the semiconductor wafer W is transferred from the transfer mechanism 10 to the susceptor 74 of the holding portion 7 and held in a horizontal attitude from below. The semiconductor wafer W is supported by a plurality of substrate support pins 77 erected on the holding plate 75 and held by the susceptor 74. In addition, the semiconductor wafer W is held by the holding portion 7 with the front surface on which the pattern is formed and impurities are implanted as the upper surface. A predetermined distance is formed between the back surface (main surface opposite to the front surface) of the semiconductor wafer W supported by the plurality of substrate support pins 77 and the holding surface 75a of the holding plate 75. The pair of transfer arms 11 lowered to below the susceptor 74 are retracted by the horizontal movement mechanism 13 to the retracted position, that is, inside the recessed portion 62.

After the semiconductor wafer W is held from below in a horizontal attitude by the susceptor 74 of the holding unit 7 made of quartz, the forty halogen lamps HL of the halogen heating unit 4 are turned on all at once to start preheating (assist heating). The halogen light emitted from the halogen lamps HL passes through the lower side chamber window 64 and the susceptor 74 made of quartz and is applied to the lower surface of the semiconductor wafer W. Receiving the light irradiation from the halogen lamps HL preheats the semiconductor wafer W and raises its temperature. It should be noted that since the transfer arms 11 of the transfer mechanism 10 are retracted inside the recessed portion 62, the transfer arms 11 do not hinder heating by the halogen lamps HL.

When the halogen lamps HL perform preheating, the temperature of the semiconductor wafer W is measured by the lower radiation thermometer 20. That is, the lower radiation thermometer 20 receives infrared light radiated through the opening 78 from the lower surface of the semiconductor wafer W held by the susceptor 74 through the transparent window 21 and measures the wafer temperature during temperature rise. The measured temperature of the semiconductor wafer W is transmitted to the control unit 3. The control unit 3 controls the output of the halogen lamps HL while monitoring whether or not the temperature of the semiconductor wafer W to be raised by light irradiation from the halogen lamps HL has reached a predetermined preheating temperature T1. That is, the control unit 3 feedback-controls the output of the halogen lamps HL so that the temperature of the semiconductor wafer W reaches the preheating temperature T1 based on the measured value by the lower radiation thermometer 20. Thus, the lower radiation thermometer 20 is a radiation thermometer for controlling the temperature of the semiconductor wafer W during preheating. The preheating temperature T1 is in the range, in which there is no risk that impurities added to the semiconductor wafer W diffuse due to heat, of about 200° C. to 800° C., preferably about 350° C. to 600° C. (600° C. in the present embodiment).

After the temperature of the semiconductor wafer W reaches the preheating temperature T1, the control unit 3 maintains the semiconductor wafer W at the preheating temperature T1 for a while. Specifically, when the temperature of the semiconductor wafer W measured by the lower radiation thermometer 20 reaches the preheating temperature T1, the control unit 3 adjusts the output of the halogen lamps HL and maintains the temperature of the semiconductor wafer W at almost the preheating temperature T1.

Performing preheating with these halogen lamps HL uniformly raises temperature of the entire semiconductor wafer W to the preheating temperature T1. At the stage of preheating with the halogen lamps HL, the temperature of the circumferential edge portion of the semiconductor wafer W which is more likely to radiate heat tends to be lower than that of the central portion, but the arrangement density of the halogen lamps HL in the halogen heating unit 4 is higher in the region facing the circumferential edge portion than in the region facing the central portion of the semiconductor wafer W. Therefore, the amount of light applied to the circumferential edge portion of the semiconductor wafer W which is more likely to radiate heat increases, and the in-plane temperature distribution of the semiconductor wafer W in the preheating stage can be made uniform.

In addition, from the time when the semiconductor wafer W is preheated, the front surface temperature of the semiconductor wafer W is measured by the upper radiation thermometer 25. From the surface of the semiconductor wafer W to be heated, infrared light with an intensity corresponding to its temperature is radiated. The infrared light radiated from the front surface of the semiconductor wafer W passes through the transparent window 26 and is received by the infrared sensor 29 of the upper radiation thermometer 25.

In the InSb optical element of the infrared sensor 29, a resistance change corresponding to the intensity of the received infrared light occurs. The resistance change occurring in the InSb optical element of the infrared sensor 29 is converted into a voltage signal by the signal conversion circuit 102. The voltage signal output from the signal conversion circuit 102 is amplified by the amplifier circuit 103 and then converted by the A/D converter 104 into a digital signal suitable for a computer to handle. Then, the temperature conversion unit 105 performs predetermined arithmetic processing on the signal output from the A/D converter 104 to convert the result into temperature data. That is, the upper radiation thermometer 25 receives infrared light radiated from the front surface of the semiconductor wafer W to be heated, and measures the front surface temperature of the semiconductor wafer W from the intensity of the infrared light.

When the temperature of the semiconductor wafer W reaches the preheating temperature T1 and a predetermined time elapses, the flash lamps FL of the flash heating unit 5 irradiate the front surface of the semiconductor wafer W held by the susceptor 74 with a flash of light. At this time, part of the flash of light radiated from the flash lamps FL goes directly into the chamber 6, the other part is once reflected by the reflector 52 and then goes into the chamber 6, and irradiation with these flashes of light flash-heats the semiconductor wafer W.

When the flash lamp FL performs irradiation with a flash of light, the power supply unit 95 stores electric charge in the capacitor 93 in advance. Then, in a state of the electric charge being stored in the capacitor 93, a pulse signal is output from the pulse generator 31 of the control unit 3 to the IGBT 96 to on-off drive the IGBT 96.

The waveform of the pulse signal can be defined by inputting a recipe in which the pulse width time (on time) and the pulse interval time (off time) are sequentially set as parameters from the input unit 33. When the operator inputs this recipe from the input unit 33 to the control unit 3, the waveform setting unit 32 of the control unit 3 accordingly sets a pulse waveform that repeats on and off. Then, the pulse generator 31 outputs a pulse signal according to the pulse waveform set by the waveform setting unit 32. As a result, the gate of the IGBT 96 is applied with a pulse signal having a set waveform, and the on-off drive of the IGBT 96 is controlled. Specifically, when the pulse signal input to the gate of the IGBT 96 is on, the IGBT 96 is turned into an ON state, and when the pulse signal is off, the IGBT 96 is turned into an OFF state.

In addition, in synchronization with the timing at which the pulse signal output from the pulse generator 31 is turned on, the control unit 3 controls the trigger circuit 97 to apply a high voltage (trigger voltage) to the trigger electrode 91. Inputting a pulse signal to the gate of the IGBT 96 with electric charge being stored in the capacitor 93 and applying a high voltage to the trigger electrode 91 in synchronization with the timing at which the pulse signal is turned on causes a current to always flow between the electrodes at both ends in the glass tube 92 when the pulse signal is on, and light is emitted by the excitation of xenon atoms or molecules at that time.

In this way, the thirty flash lamps FL of the flash heating unit 5 emit light, and the front surface of the semiconductor wafer W held by the holding unit 7 is irradiated with a flash of light. In this case, when the flash lamp FL is made to emit light without using the IGBT 96, the electric charge stored in the capacitor 93 is consumed in one light emission, and the output waveform from the flash lamp FL has a simple single pulse of about 0.1 ms to 10 ms in width. On the other hand, in the present embodiment, connecting the IGBT 96 being a switching element in the circuit and outputting a pulse signal to the gate intermittently supplies the electric charge from the capacitor 93 to the flash lamp FL with the IGBT 96 and on-off controls the current flowing through the flash lamp FL. As a result, the light emission of the flash lamp FL is, so to speak, chopper-controlled, the electric charge stored in the capacitor 93 is dividedly consumed, and the flash lamp FL repeats blinking in an extremely short time. It should be noted that before the current value flowing through the circuit becomes completely "0", the next pulse is applied to the gate of the IGBT 96 and the current value increases again, so that the emission output is not completely "0" even while the flash lamp FL repeats blinking.

On-off controlling the current flowing through the flash lamp FL with the IGBT 96 allows the light emission pattern (time waveform of the light emission output) of the flash lamp FL to be flexibly defined, and the light emission time and the light emission intensity to be freely adjusted. The on-off drive pattern of the IGBT 96 is defined by the pulse width time and the pulse interval time input from the input unit 33. That is, incorporating the IGBT 96 in the drive circuit of the flash lamp FL allows the light emission pattern of the flash lamp FL to be flexibly defined simply by appropriately setting the pulse width time and the pulse interval time input from the input unit 33.

Specifically, for example, when the ratio of the pulse width time to the pulse interval time input from the input unit 33 is increased, the current flowing through the flash lamp FL increases and the light emission intensity increases. Conversely, when the ratio of the pulse width time to the pulse interval time input from the input unit 33 is reduced, the current flowing through the flash lamp FL is reduced and the light emission intensity decreases. In addition, if the ratio between the pulse interval time and the pulse width time input from the input unit 33 is appropriately adjusted, the light emission intensity of the flash lamp FL is maintained constant. Furthermore, increasing the total time of the combination of the pulse width time and the pulse interval time input from the input unit 33 causes the current to continue flowing through the flash lamp FL for a relatively long time, and the light emission time of the flash lamp FL to increase. The light emission time of the flash lamp FL is appropriately set between 0.1 ms and 100 ms.

In this way, the flash lamps FL irradiate the front surface of the semiconductor wafer W with a flash of light for an irradiation time of 0.1 ms to 100 ms, and flash-heat the semiconductor wafer W. Then, the front surface temperature of the semiconductor wafer W flash-heated by the flash of light irradiation from the flash lamp FL momentarily rises to the treatment temperature T2 of 1000° C. or higher, the impurities implanted into the semiconductor wafer W are activated, and then the front surface temperature drops rapidly. Thus, in the heat treatment apparatus 1, applying a flash of light having an extremely short irradiation time allows the front surface temperature of the semiconductor wafer W to be raised or lowered in an extremely short time. As a result, it is possible to activate the impurities while suppressing the diffusion due to heat of the impurities implanted into the semiconductor wafer W. It should be noted that since the time required for activating impurities is extremely short as compared with the time required for thermal diffusion thereof, activation is completed even in a short time during which diffusion does not occur of about 0.1 ms to 100 ms.

Even when the front surface temperature of the semiconductor wafer W rapidly rises and falls due to a flash of light irradiation, the front surface temperature is measured by the upper radiation thermometer 25. Since the upper radiation thermometer 25 measures the front surface temperature of the semiconductor wafer W at extremely short sampling intervals, even if the front surface temperature of the semiconductor wafer W rapidly changes during a flash of light irradiation, the upper radiation thermometer 25 can follow the change.

After the flash heating treatment is completed, the halogen lamps HL are turned off after a lapse of a predetermined time. Thus, the semiconductor wafer W rapidly drops in temperature from the preheating temperature T1. The temperature of the semiconductor wafer W during drop in temperature is measured by the lower radiation thermometer 20, and the measurement result is transmitted to the control unit 3. The control unit 3 monitors whether or not the temperature of the semiconductor wafer W has dropped to a predetermined temperature based on the measurement result of the lower radiation thermometer 20. Then, after the temperature of the semiconductor wafer W drops to a predetermined temperature or less, the pair of transfer arms 11 of the transfer mechanism 10 horizontally move from the retracted position to the transfer operation position again and rise, whereby the lift pins 12 protrude from the upper surface of the susceptor 74 and receive the heat-treated semiconductor wafer W from the susceptor 74. Subsequently, the transport opening 66 closed by the gate valve 185 is opened, the semiconductor wafer W placed on the lift pins 12 is taken out by a transfer robot outside the apparatus, and heating treatment of the semiconductor wafer W in the heat treatment apparatus 1 is completed.

Figures 10, 11:
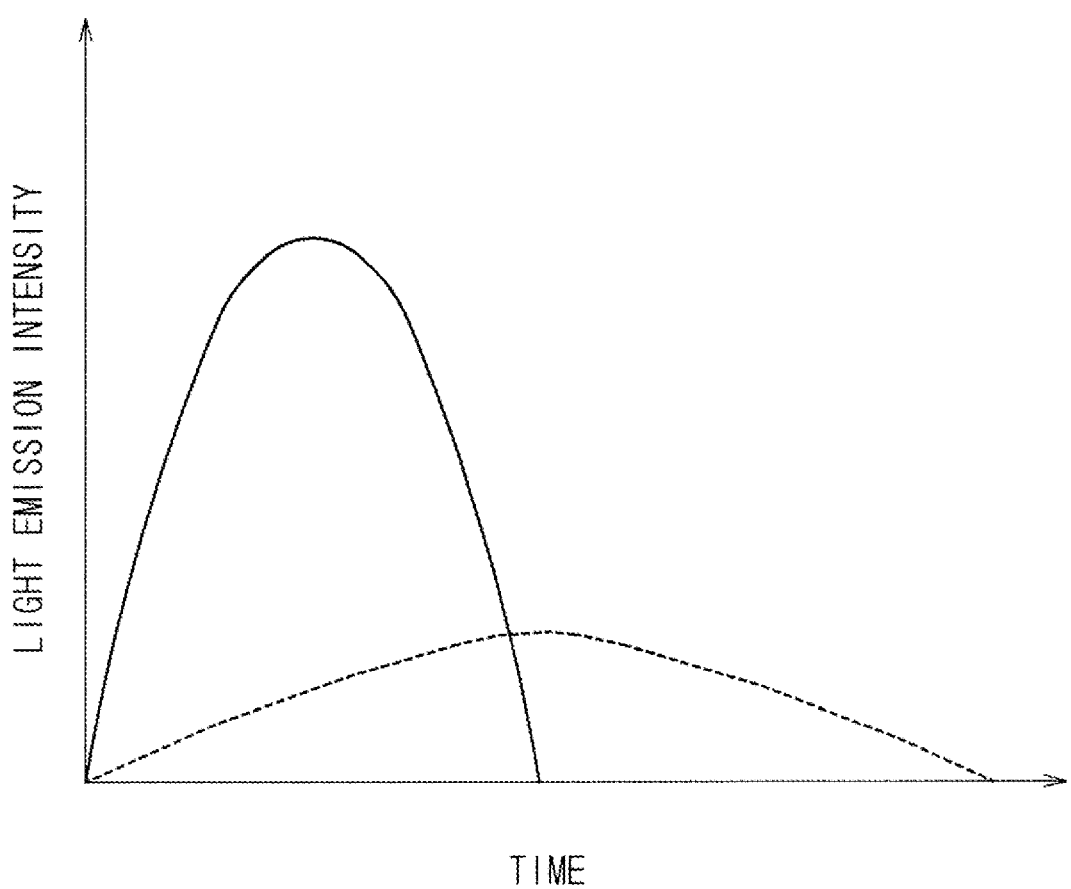
FIG. 10 is a diagram showing an example of a conversion table.
FIG. 11 is a diagram showing a light emission waveform of the flash lamp.

In the heat treatment apparatus 1 of the present embodiment, the light emission waveform of the flash lamp FL can be flexibly adjusted by the waveform of the pulse signal applied to the IGBT 96. FIG. 11 is a diagram showing a light emission waveform of the flash lamp FL. FIG. 11 shows two typical types of waveforms. When the total time of the combination of the pulse width time and the pulse interval time of the pulse signal is reduced, a light emission waveform having a relatively short light emission time is obtained as shown by the solid line in FIG. 11. Conversely, when the total time of the combination of the pulse width time and the pulse interval time of the pulse signal is increased, a light emission waveform having a relatively long light emission time is obtained as shown by the dotted line in FIG. 11.

When a flash of light having a short light emission waveform as shown by the solid line in FIG. 11 is applied, the front surface temperature of the semiconductor wafer W also rapidly rises and falls in a short time. On the other hand, when a flash of light having a long light emission waveform as shown by the dotted line in FIG. 11 is applied, the front surface temperature of the semiconductor wafer W also gradually rises and falls over a relatively long time. However, since the irradiation time of the flash of light is about 100 ms at the longest, even if a flash of light having a long light emission waveform is applied, the rising and falling time of the front surface temperature of the semiconductor wafer W is 1 second or less.

Even when the front surface temperature of the semiconductor wafer W rapidly rises and falls due to a flash of light irradiation, the front surface temperature is measured by the upper radiation thermometer 25. Since the data collection cycle (sampling interval) of the upper radiation thermometer 25 is extremely short, for example, 40 microseconds, even if the front surface temperature of the semiconductor wafer W rapidly rises or falls during a flash of light irradiation, the change can be measured.

The profile creation unit 106 sequentially accumulates a plurality of temperature data measured and acquired by the upper radiation thermometer 25 in a constant data collection cycle in the storage unit 107, whereby a temperature profile showing the time change of the front surface temperature of the semiconductor wafer W is created. Analyzing the temperature profile created by the profile creation unit 106 makes it possible to calculate the maximum reaching temperature on the front surface of the semiconductor wafer W during a flash of light irradiation and the amount of heat input into the semiconductor wafer W. At this time, if the number of data points of the temperature data constituting the temperature profile is excessively large, it takes a long time to analyze the data. Therefore, the number of points of temperature data for creating a temperature profile is defined as a fixed number, and in the present embodiment, for example, 3000 points.

However, when the front surface temperature of the semiconductor wafer W rises and falls over a relatively long period of time by applying a flash of light having a long light emission waveform, the number of data points of 3000 points may not be sufficient. For example, when a temperature profile is created from 3000 points of temperature data acquired in a data collection cycle of 40 microseconds, a temperature profile over 120 milliseconds is created. However, if the rising and falling time of the front surface temperature of the semiconductor wafer W during a flash of light irradiation is 120 milliseconds or more, part of the rising and falling time will be out of the temperature profile. In this case, the maximum reaching temperature during a flash of light irradiation may not be included in the temperature profile, and the maximum reaching temperature cannot be obtained from the temperature profile. In addition, since the entire rising and falling period of the front surface temperature is not included in the temperature profile, it is also impossible to calculate the amount of heat input into the semiconductor wafer W.

On the other hand, when the front surface temperature of the semiconductor wafer W rapidly rises and falls by applying a flash of light having a short light emission waveform, it may not be possible to measure the maximum reaching temperature during a flash of light irradiation with a data collection cycle of 40 microseconds. That is, if the front surface of the semiconductor wafer W reaches the maximum temperature within 40 microseconds from the moment when the upper radiation thermometer 25 measures the temperature, the maximum reaching temperature cannot be measured.

Therefore, in the present embodiment, the data collection cycle of the upper radiation thermometer 25 is made variable according to the rising and falling time of the front surface temperature of the semiconductor wafer W. Specifically, before a flash of light irradiation, the cycle determination unit 35 determines the data collection cycle according to the length of the light emission waveform of a flash of light based on the conversion table stored in the storage unit 36 of the control unit 3.

FIG. 10 is a diagram showing an example of a conversion table. The "flash waveform" shown in the figure represents the length of the light emission waveform of a flash of light, and more specifically, for example, the half-value width (full width at half maximum) of the light emission waveform. In the conversion table, the length of the light emission waveform of a flash of light is associated with the data collection cycle. The cycle determination unit 35 determines the data collection cycle of the upper radiation thermometer 25 from the length of the light emission waveform of a flash of light based on the conversion table in FIG. 10. The length of the light emission waveform of a flash of light has only to be acquired from the treatment recipe by the control unit 3 before the start of treatment. Alternatively, the operator of the heat treatment apparatus 1 may input the length of the light emission waveform of a flash of light from the input unit 33 before the start of treatment.

According to the example in FIG. 10, when the half-value width of the light emission waveform of a flash of light is extremely short, 0 ms or more and less than 0.6 ms, the cycle determination unit 35 determines the data collection cycle to 20 microseconds. In addition, when the half-value width of the light emission waveform of a flash of light is 0.6 ms or more and less than 60 ms, the cycle determination unit 35 determines the data collection cycle to 40 microseconds. Furthermore, when the half-value width of the light emission waveform of a flash of light is relatively long, 60 ms or more and less than 180 ms, the cycle determination unit 35 determines the data collection cycle to 80 microseconds. That is, the longer the waveform of a flash of light applied from the flash lamp FL, the longer the data collection cycle. The upper radiation thermometer 25 measures the front surface temperature of the semiconductor wafer W in a data collection cycle preset by the cycle determination unit 35 and acquires temperature data.

Figure 12:
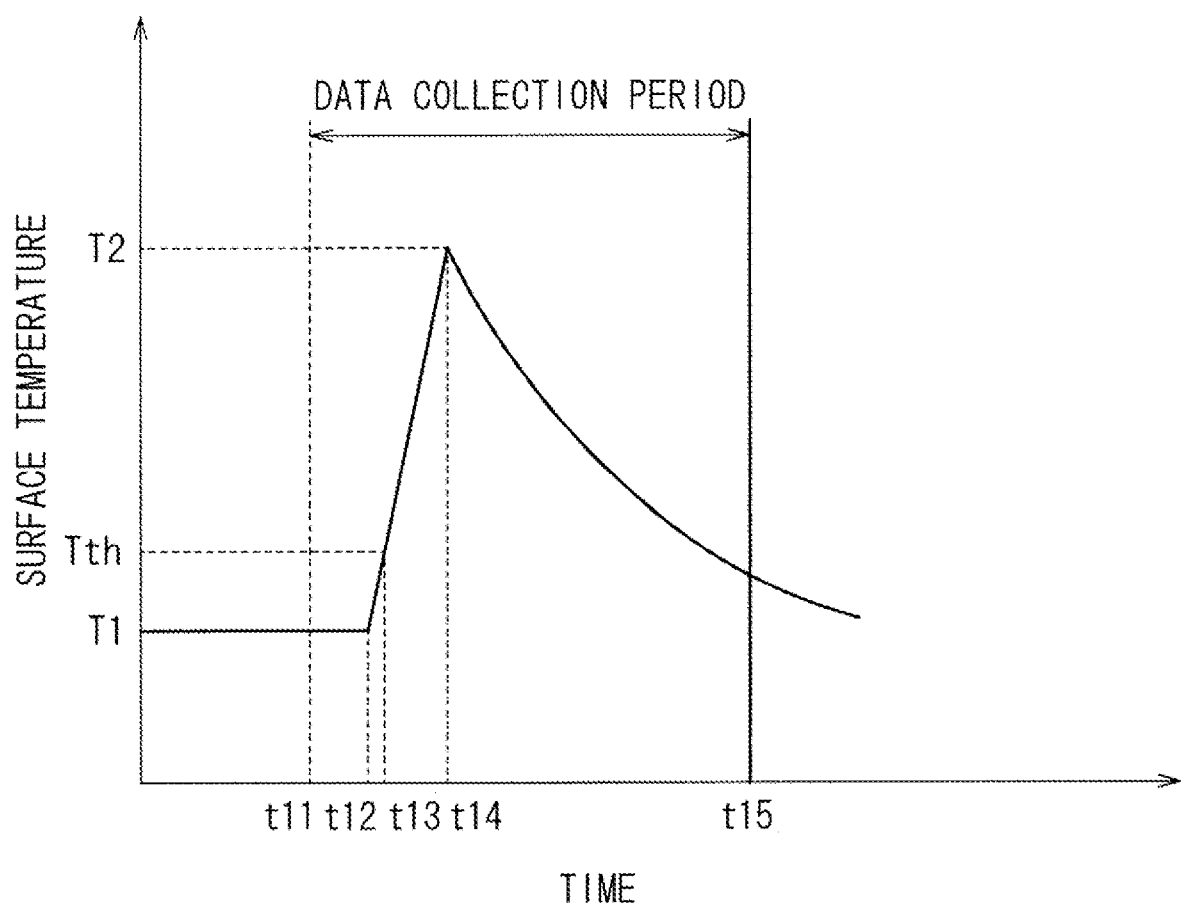
FIG. 12 is a diagram showing an example of a change in a surface temperature of a semiconductor wafer during a flash of light irradiation.

FIG. 12 is a diagram showing an example of a change in the surface temperature of the semiconductor wafer W during a flash of light irradiation. In the example in FIG. 12, the length of the light emission waveform of a flash of light is extremely short, and the data collection cycle is set to 20 microseconds. From the stage when the semiconductor wafer W is preheated to the preheating temperature T1 by light irradiation from the halogen lamps HL, the upper radiation thermometer 25 measures the front surface temperature of the semiconductor wafer W in a data collection cycle of 20 microseconds. The temperature data on the front surface of the semiconductor wafer W measured and acquired by the upper radiation thermometer 25 is temporarily stored in the memory of the high-speed radiation thermometer unit 101 (not shown).

A flash of light irradiation from the flash lamps FL is started at time t12, and the front surface temperature of the semiconductor wafer W rises rapidly from the preheating temperature T1. Then, at time t13, the front surface temperature of the semiconductor wafer W reaches the threshold temperature $T_{th}$. The threshold temperature $T_{th}$ is higher than the preheating temperature T1 by a predetermined temperature. In the present embodiment, the temperature data acquired by the upper radiation thermometer 25 a predetermined number of points (for example, 500 points) before the temperature data when the front surface temperature of the semiconductor wafer W measured by the upper radiation thermometer 25 reaches the threshold temperature $T_{th}$ is used as the starting point temperature data. In the example in FIG. 12, the temperature data acquired by the upper radiation thermometer 25 at time t11 is used as the starting point temperature data.

The front surface temperature of the semiconductor wafer W reaches the treatment temperature T2 at time t14 due to a flash of light irradiation. The treatment temperature T2 is the maximum reaching temperature on the front surface of the semiconductor wafer W during a flash of light irradiation. At and after time t14, the front surface temperature of the semiconductor wafer W drops rapidly from the treatment temperature T2. The upper radiation thermometer 25 measures the front surface temperature of the semiconductor wafer W also while the front surface of the semiconductor wafer W rises and falls in temperature, and the acquired temperature data is stored in the memory.

The temperature profile creation unit 106 extracts temperature data of 3000 points at and after the starting point temperature data from the memory of the high-speed radiation thermometer unit 101 to create a temperature profile. The temperature data of the 3000th point at and after the starting point temperature data is acquired at time t15. That is, in the example in FIG. 12, the temperature profile is created from the temperature data of 3000 points acquired between the time t11 and the time t15. Since the data collection cycle is 20 microseconds, the time from time t11 to time t15 is 60 ms, and a temperature profile is created from the temperature data of 3000 points over 60 ms before and after the start of a flash of light irradiation. The created temperature profile may be displayed on the display unit 34.

Since the temperature data acquired a predetermined number of points before the temperature data when the front surface temperature of the semiconductor wafer W reaches the threshold temperature $T_{th}$ is used as the starting point temperature data, and the temperature profile is created from the temperature data of 3000 points at and after the starting point temperature data, the temperature profile can include the temperature change from the preheating to the start of a flash of light irradiation to the rise in the front surface temperature of the semiconductor wafer W to going through the treatment temperature T2 to the fall.

In addition, the data collection cycle is also set to a short time of 20 microseconds according to the length of the light emission waveform of an extremely short flash of light. Therefore, the resolution of the upper radiation thermometer 25 is high, and the maximum reaching temperature on the front surface of the semiconductor wafer W (treatment temperature T2) during a flash of light irradiation can be reliably measured. When the data collection cycle is short, the data collection period from time t11 to time t15 is also short, but when the length of the light emission waveform of a flash of light is extremely short, the rising and falling time of the front surface temperature of the semiconductor wafer W is also short, so that the entire rising and falling period of the front surface temperature can be included in the temperature profile. As a result, analyzing the created temperature profile allows the maximum reaching temperature on the front surface of the semiconductor wafer W and the amount of heat input into the semiconductor wafer W to be accurately calculated.

Figure 13:
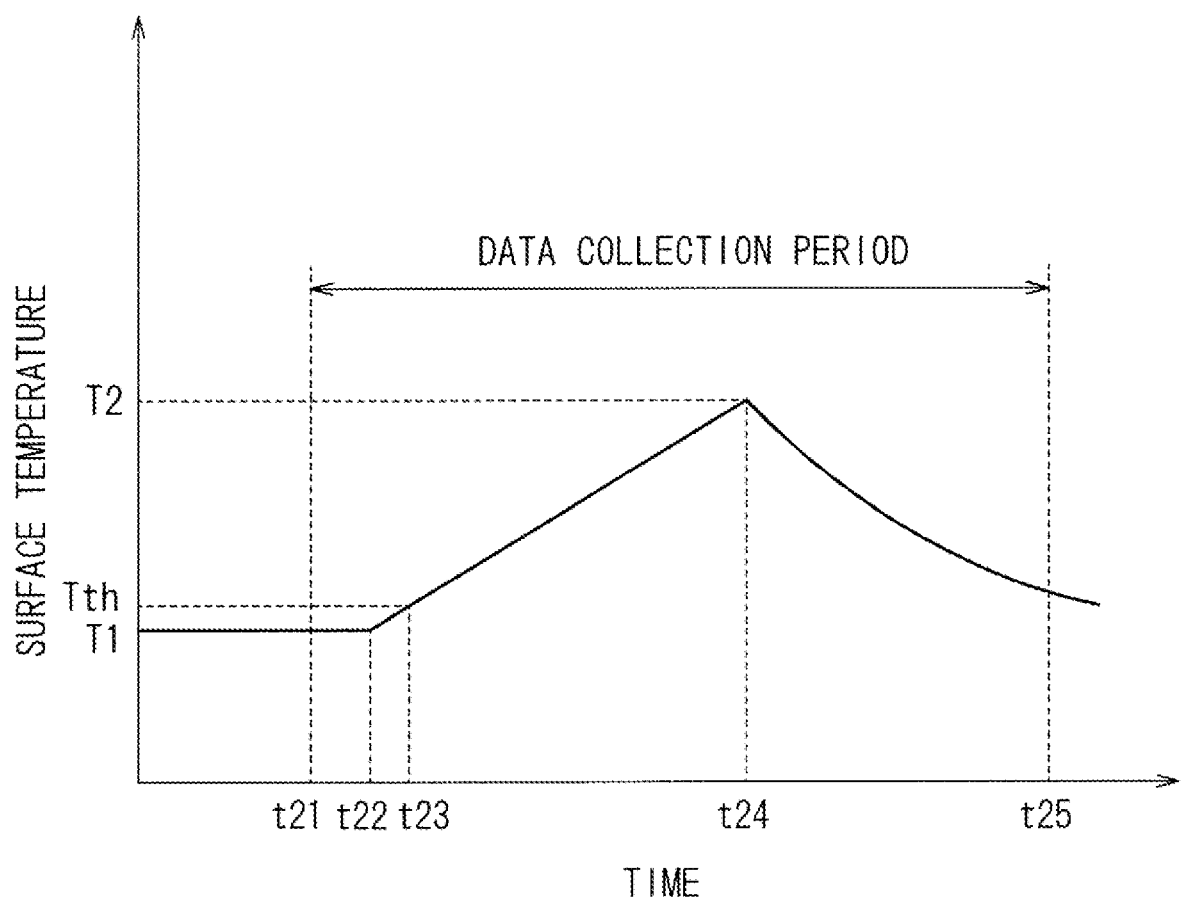
FIG. 13 is a diagram showing another example of a change in the surface temperature of the semiconductor wafer during a flash of light irradiation.

FIG. 13 is a diagram showing another example of a change in the surface temperature of the semiconductor wafer W during a flash of light irradiation. In the example in FIG. 13, the length of the light emission waveform of a flash of light is relatively long, and the data collection cycle is set to 80 microseconds. From the stage when the semiconductor wafer W is preheated to the preheating temperature T1 by light irradiation from the halogen lamps HL, the upper radiation thermometer 25 measures the front surface temperature of the semiconductor wafer W in a data collection cycle of 80 microseconds, and the acquired temperature data is temporarily stored in the memory of the high-speed radiation thermometer unit 101.

A flash of light irradiation from the flash lamps FL is started at time t22, and the front surface temperature of the semiconductor wafer W rises from the preheating temperature T1. The temperature rise rate in FIG. 13 is slower than the temperature rise rate in FIG. 12. Then, at time t23, the front surface temperature of the semiconductor wafer W reaches the threshold temperature $T_{th}$. The threshold temperature $T_{th}$ is higher than the preheating temperature T1 by a predetermined temperature. Similarly to the above, the temperature data acquired by the upper radiation thermometer 25 a predetermined number of points (for example, 500 points) before the temperature data when the front surface temperature of the semiconductor wafer W measured by the upper radiation thermometer 25 reaches the threshold temperature $T_{th}$ is used as the starting point temperature data. In the example in FIG. 13, the temperature data acquired by the upper radiation thermometer 25 at time t21 is used as the starting point temperature data.

The front surface temperature of the semiconductor wafer W reaches the treatment temperature T2 at time t24 due to a flash of light irradiation. The treatment temperature T2 is the maximum reaching temperature on the front surface of the semiconductor wafer W during a flash of light irradiation. At and after time t24, the front surface temperature of the semiconductor wafer W drops from the treatment temperature T2. The upper radiation thermometer 25 measures the front surface temperature of the semiconductor wafer W also while the front surface of the semiconductor wafer W rises and falls in temperature, and the acquired temperature data is stored in the memory.

The temperature profile creation unit 106 extracts temperature data of 3000 points at and after the starting point temperature data from the memory of the high-speed radiation thermometer unit 101 to create a temperature profile. The temperature data of the 3000th point at and after the starting point temperature data is acquired at time t25. That is, in the example in FIG. 13, the temperature profile is created from the temperature data of 3000 points acquired between the time t21 and the time t25. Since the data collection cycle is 80 microseconds, the time from time t21 to time t25 is 240 ms, and a temperature profile is created from the temperature data of 3000 points over 240 ms before and after the start of a flash of light irradiation. The created temperature profile may be displayed on the display unit 34.

Since the temperature data acquired a predetermined number of points before the temperature data when the front surface temperature of the semiconductor wafer W reaches the threshold temperature $T_{th}$ is used as the starting point temperature data, and the temperature profile is created from the temperature data of 3000 points at and after the starting point temperature data, the temperature profile can include the temperature change from the preheating to the start of a flash of light irradiation to the rise in the front surface temperature of the semiconductor wafer W to going through the treatment temperature T2 to the fall.

In addition, the data collection cycle is also set to 80 microseconds according to the length of the light emission waveform of a relatively long flash of light. In the example in FIG. 13, the length of the light emission waveform of a flash of light is relatively long, and the rising and falling time of the front surface temperature of the semiconductor wafer W also becomes longer, but the data collection cycle is also relatively long, 80 microseconds, and the data collection period from time t21 to time t25 is four times that of the example in FIG. 12. Therefore, even if the rising and falling time of the front surface temperature of the semiconductor wafer W is long, the entire rising and falling period of the front surface temperature can be included in the temperature profile. On the other hand, when the data collection cycle is long, the resolution of the upper radiation thermometer 25 decreases, but since in the example in FIG. 13, the front surface temperature of the semiconductor wafer W rises and falls relatively gently, even when the resolution of the upper radiation thermometer 25 is slightly low, the maximum reaching temperature on the front surface of the semiconductor wafer W (treatment temperature T2) during a flash of light irradiation can be reliably measured. As a result, analyzing the created temperature profile allows the maximum reaching temperature on the front surface of the semiconductor wafer W and the amount of heat input into the semiconductor wafer W to be accurately calculated.

In the present embodiment, the length of the light emission waveform of a flash of light applied from the flash lamp FL can be adjusted by the waveform of the pulse signal applied to the IGBT 96. Then, the data collection cycle of the upper radiation thermometer 25 is variable according to the length of the light emission waveform of a flash of light. When the length of the light emission waveform of a flash of light is short, the data collection cycle is also set short, and when the length of the light emission waveform of a flash of light is long, the data collection cycle is also set long.

When the length of the light emission waveform of a flash of light is short, the rising and falling period of the front surface temperature of the semiconductor wafer W is also short, and when the length of the light emission waveform of a flash of light is long, the rising and falling period of the front surface temperature of the semiconductor wafer W is also long. In the present embodiment, since the data collection cycle is made variable according to the length of the light emission waveform of a flash of light, even when the rising and falling period of the front surface temperature of the semiconductor wafer W changes due to the length of the light emission waveform, the temperature change can be included in the temperature profile with a constant number of data points until the front surface temperature rises, goes through the maximum reaching temperature, and falls. That is, the temperature profile can be appropriately created regardless of the temperature rising time of the semiconductor wafer W.

In addition, in the present embodiment, the cycle determination unit 35 determines the data collection cycle from the length of the light emission waveform of a flash of light based on the conversion table. Therefore, it is possible to prevent the operator from making a mistake in changing the data collection cycle.

Furthermore, in the present embodiment, collection is started from the temperature data a predetermined number of points before the temperature data when the front surface temperature of the semiconductor wafer W reaches the threshold temperature $T_{th}$ higher than the preheating temperature T1. Therefore, the front surface temperature of the semiconductor wafer W at the time when a flash of light irradiation from the flash lamp FL is started can be surely included in the temperature profile.

Second Embodiment

Figure 14:
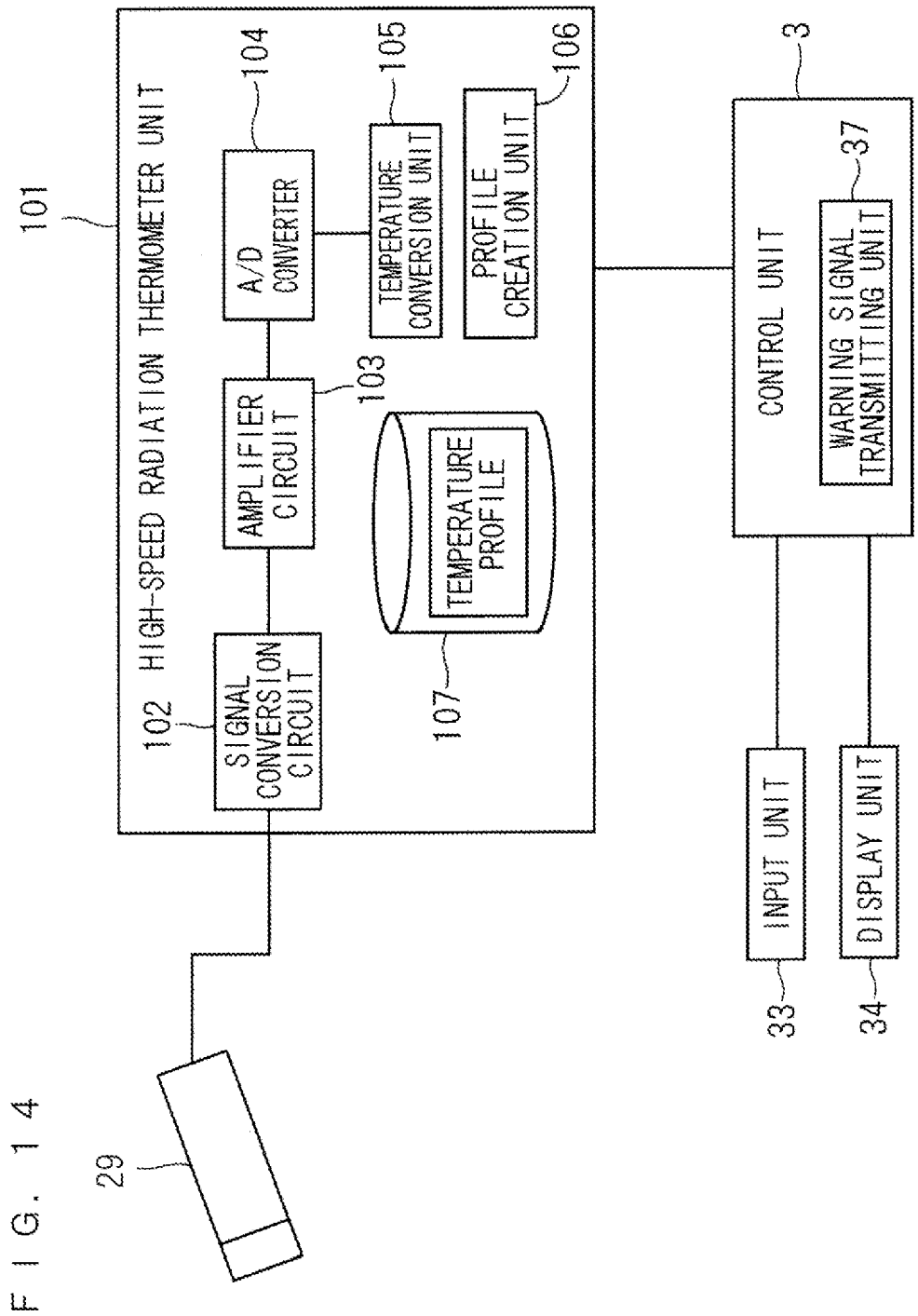
FIG. 14 is a block diagram showing a configuration of a high-speed radiation thermometer unit of a second embodiment.

The configuration of the heat treatment apparatus of the second embodiment is substantially the same as that of the first embodiment. FIG. 14 is a block diagram showing the configuration of the high-speed radiation thermometer unit 101 of the second embodiment. In FIG. 14, the same elements as those in FIG. 9 of the first embodiment are denoted by the same reference numerals. As shown in FIG. 14, the control unit 3 of the second embodiment includes a warning signal transmitting unit 37 in addition to the pulse generator 31 and the waveform setting unit 32 (not shown in FIG. 9). The warning signal transmitting unit 37 transmits a flash warning signal to the high-speed radiation thermometer unit 101 a preset predetermined time (for example, 1 second) before the time when a flash of light irradiation from the flash lamp FL is started.

Figure 15:
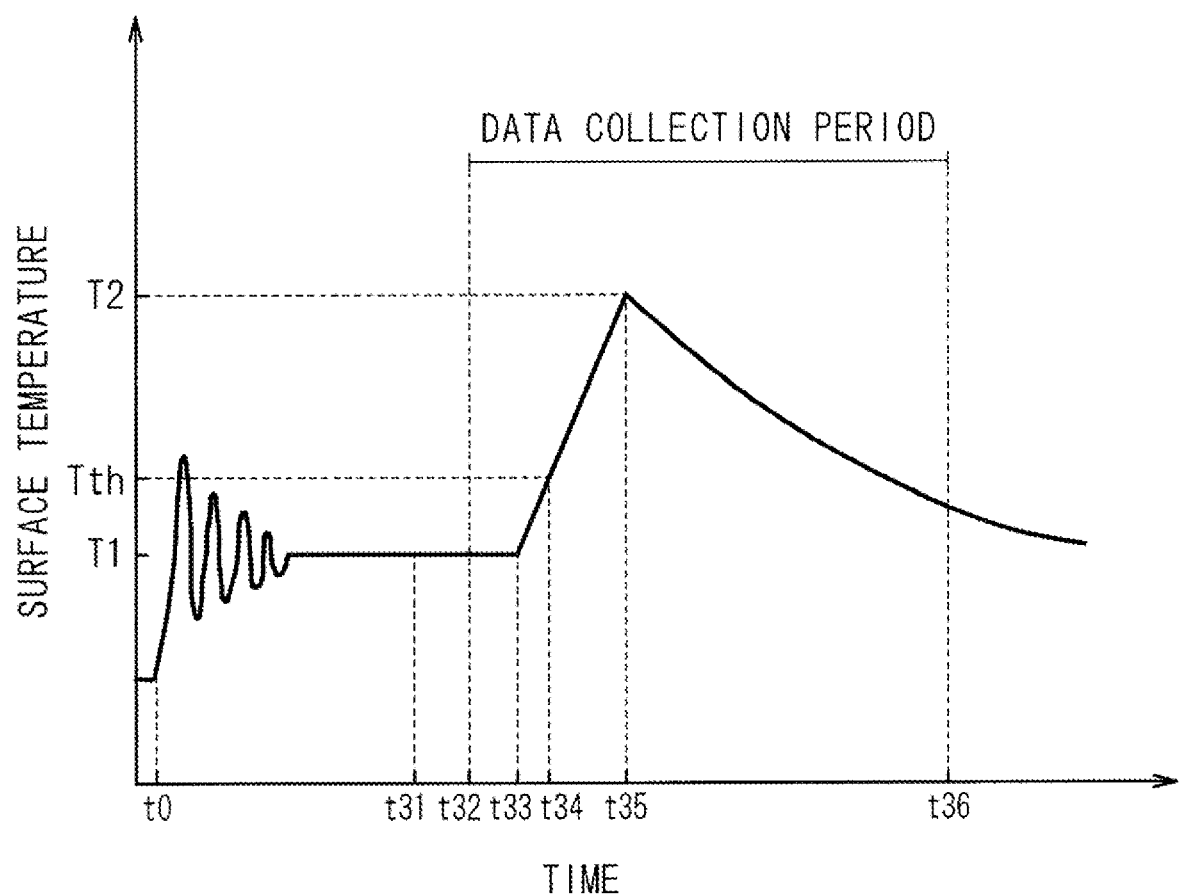
FIG. 15 is a diagram showing measured values of the upper radiation thermometer before and after the flash of light irradiation.

In addition, the procedure for heat treatment for the semiconductor wafer W of the second embodiment is also almost the same as that of the first embodiment. FIG. 15 is a diagram showing the measured values of the upper radiation thermometer 25 before and after the flash of light irradiation. In the heat treatment apparatus 1 of the second embodiment, from the stage when the semiconductor wafer W is preheated to the preheating temperature T1 by light irradiation from the halogen lamps HL, the upper radiation thermometer 25 measures the front surface temperature of the semiconductor wafer W. The upper radiation thermometer 25 measures the front surface temperature even when the front surface temperature of the semiconductor wafer W rapidly rises and falls due to a flash of light irradiation. Since the data collection cycle (sampling interval) of the upper radiation thermometer 25 is extremely short, for example, 40 microseconds, even if the front surface temperature of the semiconductor wafer W rapidly rises or falls during a flash of light irradiation, the change can be measured.

The plurality of temperature data acquired by the upper radiation thermometer 25 measuring the front surface temperature of the semiconductor wafer W in a data collection cycle of 40 microseconds are temporarily stored in the memory of the high-speed radiation thermometer unit 101 (not shown). The profile creation unit 106 creates a temperature profile showing a time change of the front surface temperature of the semiconductor wafer W by sequentially accumulating in the storage unit 107 some of a plurality of temperature data stored in the memory. Analyzing the temperature profile created by the profile creation unit 106 makes it possible to calculate the maximum reaching temperature on the front surface of the semiconductor wafer W during a flash of light irradiation and the amount of heat input into the semiconductor wafer W. At this time, if the number of data points of the temperature data constituting the temperature profile is excessively large, it takes a long time to analyze the data. Therefore, the number of points of temperature data for creating a temperature profile is defined as a fixed number, and in the second embodiment, for example, 3000 points. That is, the profile creation unit 106 extracts 3000 points of temperature data from a plurality of temperature data measured and acquired by the upper radiation thermometer 25 from the preheating stage to the time of a flash of light irradiation to create a temperature profile. When the data collection cycle is 40 microseconds, a temperature profile of 120 ms will be created. Therefore, it is necessary to set the range for extracting the temperature data so that the front surface temperature of the semiconductor wafer W before and after the flash of light irradiation is appropriately included in the temperature profile.

In the example in FIG. 15, a flash of light irradiation from the flash lamps FL is started at time t33, and the front surface temperature of the semiconductor wafer W rises rapidly from the preheating temperature T1. Then, at time t34, the front surface temperature of the semiconductor wafer W reaches the threshold temperature $T_{th}$. The threshold temperature $T_{th}$ is higher than the preheating temperature T1 by a predetermined temperature. In the present embodiment, the temperature data acquired by the upper radiation thermometer 25 a predetermined number of points (for example, 500 points) before the temperature data when the front surface temperature of the semiconductor wafer W measured by the upper radiation thermometer 25 reaches the threshold temperature $T_{th}$ is used as the starting point temperature data. In the example in FIG. 15, the temperature data acquired by the upper radiation thermometer 25 at time t32 is used as the starting point temperature data.

The front surface temperature of the semiconductor wafer W reaches the treatment temperature T2 at time t35 due to a flash of light irradiation. The treatment temperature T2 is the maximum reaching temperature on the front surface of the semiconductor wafer W during a flash of light irradiation. At and after time t35, the front surface temperature of the semiconductor wafer W drops rapidly from the treatment temperature T2. The upper radiation thermometer 25 measures the front surface temperature of the semiconductor wafer W also while the front surface of the semiconductor wafer W rises and falls in temperature, and the acquired temperature data is stored in the memory.

The temperature profile creation unit 106 extracts temperature data of 3000 points at and after the starting point temperature data from the memory of the high-speed radiation thermometer unit 101 to create a temperature profile. The temperature data of the 3000th point at and after the starting point temperature data is acquired at time t36. That is, in the example in FIG. 15, the temperature profile is created from the temperature data of 3000 points acquired between the time t32 and the time t36. Since the data collection cycle is 40 microseconds, the time from time t32 to time t36 is 120 ms, and a temperature profile is created from the temperature data of 3000 points over 120 ms before and after the start of a flash of light irradiation.

In this way, setting the extraction range of temperature data as the trigger that the front surface temperature of the semiconductor wafer W reaches the threshold temperature $T_{th}$, a predetermined temperature higher than the preheating temperature T1, allows the front surface temperature of the semiconductor wafer W before and after the start of a flash of light irradiation to be appropriately included in the temperature profile.

However, as shown in FIG. 15, the measured value of the upper radiation thermometer 25 may fluctuate significantly immediately after the halogen lamp HL is lit for preheating at time t0. Such fluctuations in measured values can be considered to be caused by the possibility that immediately after the halogen lamp HL is turned on, the light emitted from the halogen lamp HL and incident on the chamber 6 wraps upward from the side of the semiconductor wafer W and is incident on the upper radiation thermometer 25. Immediately after the halogen lamp HL is turned on, when the measured value of the upper radiation thermometer 25 fluctuates greatly and reaches the threshold temperature $T_{th}$ or more, the temperature data for the temperature profile is extracted with its state as a trigger. In this case, the temperature profile does not include the front surface temperature of the semiconductor wafer W before and after the start of a flash of light irradiation. That is, an erroneous detection of the trigger occurs.

If the threshold temperature $T_{th}$ is set to a considerably higher temperature than the preheating temperature T1, even if the measured value of the upper radiation thermometer 25 fluctuates significantly immediately after the halogen lamp HL is turned on, it is possible to prevent the threshold temperature $T_{th}$ from being reached. However, depending on the purpose of the flash heating treatment, there is treatment of lowering the charging voltage to the capacitor 93 to intentionally decrease the light emission intensity of the flash lamp FL (low voltage flash). When the threshold temperature $T_{th}$ is set to a remarkably high temperature, the threshold temperature $T_{th}$ may be higher than the treatment temperature T2 being the maximum temperature reached by the front surface of the semiconductor wafer W in the low voltage flash. In this case, the trigger will not be detected, and the temperature profile cannot be created properly yet.

Therefore, in the second embodiment, the warning signal transmitting unit 37 transmits a flash warning signal to the high-speed radiation thermometer unit 101 halfway through the preheating later than the time immediately after the start of the preheating, and before the flash lamp FL starts a flash of light irradiation. In the example in FIG. 15, the warning signal transmitting unit 37 transmits a flash warning signal at time t31 one second before the flash lamp FL starts a flash of light irradiation. Then, the high-speed radiation thermometer unit 101 executes the threshold value determination after receiving the flash warning signal. That is, after the flash warning signal is transmitted, the temperature data acquired by the upper radiation thermometer 25 a predetermined number of points (for example, 500 points) before the temperature data when the front surface temperature of the semiconductor wafer W measured by the upper radiation thermometer 25 reaches the threshold temperature $T_{th}$ is used as the starting point temperature data. In this way, it is possible to appropriately set as a trigger the fact that the front surface temperature of the semiconductor wafer W reaches the threshold temperature $T_{th}$ at time t34. Then, the temperature data acquired a predetermined number of points before the temperature data when the front surface temperature of the semiconductor wafer W reaches the threshold temperature $T_{th}$ at time t34 is set as the starting point temperature data, and extracting the temperature data of 3000 points at and after the starting point temperature data creates a temperature profile. Thus, the front surface temperature of the semiconductor wafer W at the time when a flash of light irradiation from the flash lamp FL is started can be reliably included in the temperature profile, and the temperature profile can be appropriately created.

The created temperature profile may be displayed on the display unit 34. In addition, analyzing the created temperature profile calculates the maximum reaching temperature on the front surface of the semiconductor wafer W during a flash of light irradiation and the amount of heat input into the semiconductor wafer W. Furthermore, the analysis result may be displayed on the display unit 34.

In addition, the threshold temperature $T_{th}$ is set within a range higher than the preheating temperature T1 and lower than the treatment temperature T2 being the maximum temperature reached by the front surface of the semiconductor wafer W by a flash of light irradiation. That is, executing the threshold value determination after receiving the flash warning signal allows the threshold temperature $T_{th}$ to be set relatively low. Thus, even with a low-voltage flash, it can be reliably detected that the front surface temperature of the semiconductor wafer W measured by the upper radiation thermometer 25 has reached the threshold temperature $T_{th}$ after the flash warning signal is transmitted.

Third Embodiment

The configuration of the heat treatment apparatus of the third embodiment is substantially the same as that of the second embodiment. The control unit 3 of the third embodiment also includes a warning signal transmitting unit 37 (FIG. 14) in addition to the pulse generator 31 and the waveform setting unit 32 (not shown in FIG. 9). In addition, the procedure for heat treatment for the semiconductor wafer W of the third embodiment is almost the same as that of the first embodiment.

Figure 16:
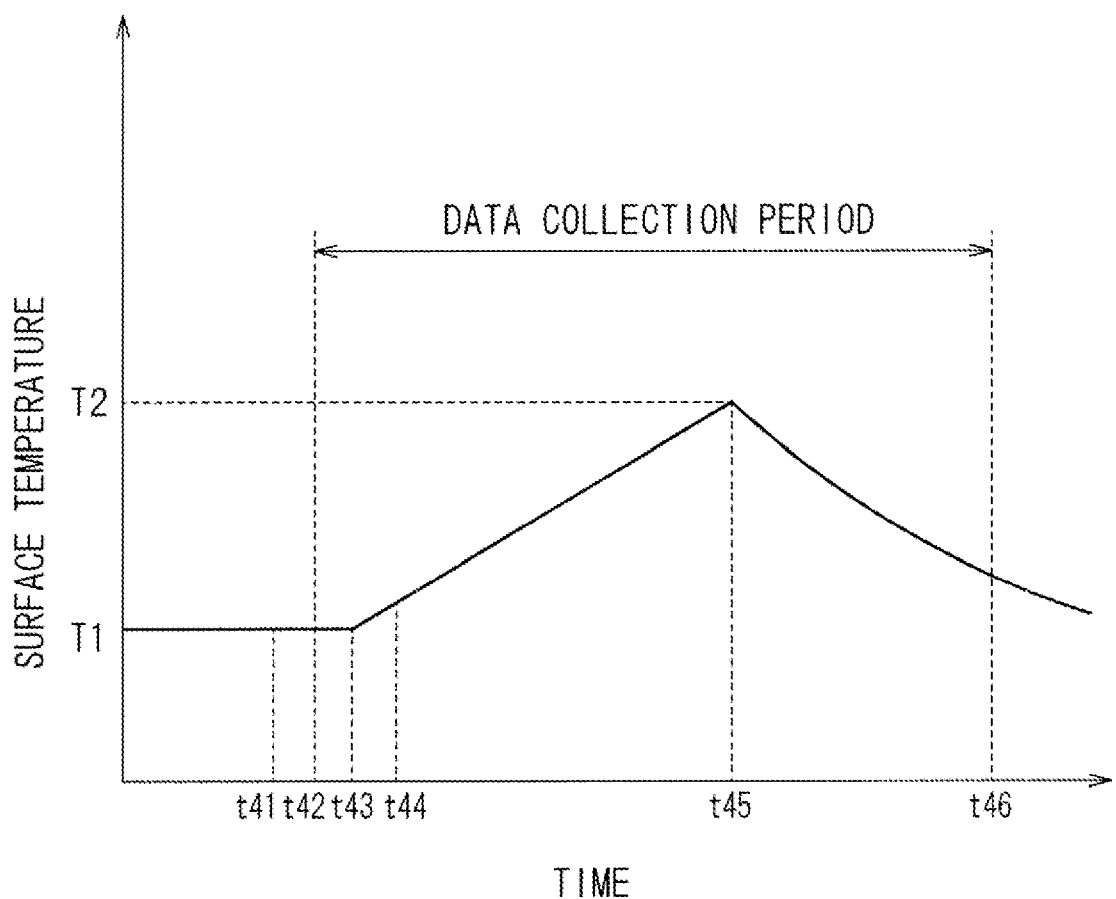
FIG. 16 is a diagram showing the measured values of the upper radiation thermometer before and after the flash of light irradiation.

FIG. 16 is a diagram showing the measured values of the upper radiation thermometer 25 before and after the flash of light irradiation. In the heat treatment apparatus 1 of the third embodiment, from the stage when the semiconductor wafer W is preheated to the preheating temperature T1 by light irradiation from the halogen lamps HL, the upper radiation thermometer 25 measures the front surface temperature of the semiconductor wafer W. The upper radiation thermometer 25 measures the front surface temperature even when the front surface temperature of the semiconductor wafer W rapidly rises and falls due to a flash of light irradiation. Since the data collection cycle (sampling interval) of the upper radiation thermometer 25 is extremely short, for example, 40 microseconds, even if the front surface temperature of the semiconductor wafer W rapidly rises or falls during a flash of light irradiation, the change can be measured.

The plurality of temperature data acquired by the upper radiation thermometer 25 measuring the front surface temperature of the semiconductor wafer W in a data collection cycle of 40 microseconds are temporarily stored in the memory of the high-speed radiation thermometer unit 101 (not shown). The profile creation unit 106 creates a temperature profile showing a time change of the front surface temperature of the semiconductor wafer W by sequentially accumulating in the storage unit 107 some of a plurality of temperature data stored in the memory. Analyzing the temperature profile created by the profile creation unit 106 makes it possible to calculate the maximum reaching temperature on the front surface of the semiconductor wafer W during a flash of light irradiation and the amount of heat input into the semiconductor wafer W. At this time, if the number of data points of the temperature data constituting the temperature profile is excessively large, it takes a long time to analyze the data. Therefore, the number of points of temperature data for creating a temperature profile is defined as a fixed number, and in the third embodiment, for example, 3000 points. That is, the profile creation unit 106 extracts 3000 points of temperature data from a plurality of temperature data measured and acquired by the upper radiation thermometer 25 from the preheating stage to the time of a flash of light irradiation to create a temperature profile. When the data collection cycle is 40 microseconds, a temperature profile of 120 ms will be created. Therefore, it is necessary to set the range for extracting the temperature data so that the front surface temperature of the semiconductor wafer W before and after the flash of light irradiation is appropriately included in the temperature profile.

As one of the methods of setting the range in which temperature data are extracted, it is conceivable to extract 3000 points of temperature data from the temperature data acquired a predetermined number of points before the temperature data when the front surface temperature of the semiconductor wafer W reaches a predetermined threshold temperature after the start of a flash of light irradiation. That is, the extraction range of the temperature data is set by setting as a trigger the fact that the front surface temperature of the semiconductor wafer W reaches the threshold temperature being a predetermined temperature higher than the preheating temperature T1.

However, in the heat treatment apparatus 1 of the third embodiment, the light emission waveform of the flash lamp FL can be flexibly adjusted by the waveform of the pulse signal applied to the IGBT 96. For example, when the total time of the combination of the pulse width time and the pulse interval time of the pulse signal is reduced, a light emission waveform having a relatively short light emission time is obtained. Conversely, if the total time of the combination of the pulse width time and the pulse interval time of the pulse signal is lengthened, a light emission waveform having a relatively long light emission time is obtained. When a flash of light having a long light emission waveform is applied, the front surface temperature of the semiconductor wafer W also gradually rises and falls over a relatively long time. However, since the irradiation time of the flash of light is about 100 ms at the longest, even if a flash of light having a long light emission waveform is applied, the rising and falling time of the front surface temperature of the semiconductor wafer W is 1 second or less.

When the front surface temperature of the semiconductor wafer W is gradually raised by applying a flash of light having a long light emission waveform, it takes a long time for the front surface temperature to reach the threshold temperature. Then, the temperature data acquired a predetermined number of points before the temperature data when the front surface temperature of the semiconductor wafer W reaches the threshold temperature may be the data acquired after the start of a flash of light irradiation. In this case, it is not possible to create a temperature profile before the start of a flash of light irradiation.

Therefore, in the third embodiment, first, the warning signal transmitting unit 37 transmits a flash warning signal to the high-speed radiation thermometer unit 101 halfway through the preheating before the flash lamp FL starts a flash of light irradiation. In the example in FIG. 16, the warning signal transmitting unit 37 transmits a flash warning signal at time t41 one second before time t43 when the flash lamp FL starts a flash of light irradiation. Then, the high-speed radiation thermometer unit 101 executes the inclination determination of the front surface temperature of the semiconductor wafer W after receiving the flash warning signal.

Figure 17:
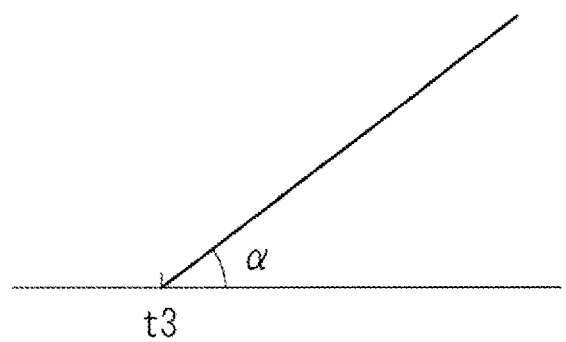
FIG. 17 is a diagram showing an inclination of the surface temperature of the semiconductor wafer after a start of a flash of light irradiation.

FIG. 17 is a diagram showing the inclination α of the surface temperature of the semiconductor wafer W after the start of a flash of light irradiation. The inclination α is the inclination of the front surface temperature of the semiconductor wafer W measured by the upper radiation thermometer 25 with respect to time. The high-speed radiation thermometer unit 101 determines whether or not the inclination α continuously exceeds a predetermined threshold value (for example, 4° C./40 microseconds) for a certain period of time (for example, 80 microseconds) or more. Then, when the inclination α is continuously not less than a predetermined threshold value for a certain period of time or more, it is determined that a flash of light irradiation has been started. Even at the stage where the semiconductor wafer W is preheated to the preheating temperature T1, the inclination α may momentarily be not less than the threshold value due to a slight temperature fluctuation, but it does not continue for a certain period of time or more. That is, determining whether or not the inclination α is continuously not less than a predetermined threshold value for a certain period of time or more prevents the temperature fluctuation during preheating from being erroneously detected as the start of a flash of light irradiation.

In the example in FIG. 16, a flash of light irradiation from the flash lamps FL is started at time t43, and the front surface temperature of the semiconductor wafer W rises from the preheating temperature T1. Then, it is determined at time t44 that the inclination α of the front surface temperature of the semiconductor wafer W measured by the upper radiation thermometer 25 with respect to time is continuously not less than a predetermined threshold value for a certain period of time or more. In the third embodiment, the temperature data acquired by the upper radiation thermometer 25 a predetermined number of points (for example, 500 points) before the temperature data at time t44 when it is determined that the inclination α is continuously not less than a predetermined threshold value for a certain period of time or more is set as the starting point temperature data. In the example in FIG. 16, the temperature data acquired by the upper radiation thermometer 25 at time t42 is used as the starting point temperature data.

The front surface temperature of the semiconductor wafer W reaches the treatment temperature T2 at time t45 due to a flash of light irradiation. The treatment temperature T2 is the maximum reaching temperature on the front surface of the semiconductor wafer W during a flash of light irradiation. At and after time t45, the front surface temperature of the semiconductor wafer W drops from the treatment temperature T2. The upper radiation thermometer 25 measures the front surface temperature of the semiconductor wafer W also while the front surface of the semiconductor wafer W rises and falls in temperature, and the acquired temperature data is stored in the memory.

The temperature profile creation unit 106 extracts temperature data of 3000 points at and after the starting point temperature data from the memory of the high-speed radiation thermometer unit 101 to create a temperature profile. The temperature data of the 3000th point at and after the starting point temperature data is acquired at time t46. That is, in the example in FIG. 16, the temperature profile is created from the temperature data of 3000 points acquired between the time t42 and the time t46. Since the data collection cycle is 40 microseconds, the time from time t42 to time t46 is 120 ms, and a temperature profile is created from the temperature data of 3000 points over 120 ms before and after the start of a flash of light irradiation.

Thus, in the third embodiment, it is determined from the inclination α of the front surface temperature of the semiconductor wafer W with respect to time whether or not a flash of light irradiation is started. The temperature data acquired a predetermined number of points before the temperature data when the inclination α is continuously not less than a threshold value for a certain period of time or more is set as the starting point temperature data, and extracting the temperature data of 3000 points at and after the starting point temperature data creates a temperature profile. Thus, the front surface temperature of the semiconductor wafer W from before a flash of light irradiation from the flash lamp FL is started can be reliably included in the temperature profile, and the temperature profile can be appropriately created.

The created temperature profile may be displayed on the display unit 34. In addition, analyzing the created temperature profile calculates the maximum reaching temperature on the front surface of the semiconductor wafer W during a flash of light irradiation and the amount of heat input into the semiconductor wafer W. Furthermore, the analysis result may be displayed on the display unit 34.

Modification

Although the embodiments of the present invention have been described above, the present invention can be changed in various ways in addition to those described above without departing from the spirit of the present invention. For example, in the first embodiment, the data collection cycle is changed to three stages based on the conversion table in FIG. 10, but the present invention is not limited to this, and the data collection cycle may be changed to two stages or four stages or more depending on the length of the light emission waveform of the flash of light. In addition, the numerical values of the data collection cycle are not limited to the example in FIG. 10 either.

In addition, in the second and third embodiments, the warning signal transmitting unit 37 transmits a flash warning signal one second before the start of a flash of light irradiation, but the present invention is not limited to this, and the warning signal transmitting unit 37 has only to transmit a flash warning signal at an appropriate timing if the time is before the start of a flash of light irradiation.

In addition, in the third embodiment, the inclination determination is executed after the warning signal transmitting unit 37 transmits the flash warning signal, but if the start of a flash of light irradiation is determined depending on the inclination α of the front surface temperature of the semiconductor wafer W, a flash of light warning signal is not always essential. As described above, if it is determined whether or not the inclination α is continuously not less than a predetermined threshold value for a certain period of time or more, it is possible to prevent the temperature fluctuation during preheating from being erroneously detected as the start of a flash of light irradiation. However, when determination with the inclination α is executed after the warning signal transmitting unit 37 transmits the flash warning signal, it is possible to more reliably prevent the temperature fluctuation during preheating from being erroneously detected as the start of a flash of light irradiation.

In addition, in the third embodiment, it is determined whether or not the inclination α is continuously 4° C./40 microseconds or more for 80 microseconds or more, but the present invention is not limited to this, and the threshold value and the duration for determining the inclination α can be set to appropriate values.

In addition, in the above embodiments, the number of points of the temperature data for creating the temperature profile is 3000 points, but the present invention is not limited to this, and an appropriate number of points of data can be set. The number of points returned from the temperature data, when the front surface temperature of the semiconductor wafer W reaches the threshold temperature $T_{th}$ or when the inclination α is continuously not less than the threshold value for a certain period of time or more, to the starting point temperature data is not limited to 500 points either, and can be set to an appropriate number of points.

In addition, in the above embodiments, the flash heating unit 5 includes thirty flash lamps FL, but the present invention is not limited to this, and the number of flash lamps FL can be any number. In addition, the flash lamp FL is not limited to the xenon flash lamp, and may be a krypton flash lamp. In addition, the number of halogen lamps HL included in the halogen heating unit 4 is not limited to forty either, and can be any number.

In addition, in the above embodiments, the semiconductor wafer W is preheated using a filament type halogen lamp HL as a continuously lit lamp that continuously emits light for 1 second or more, but the present invention is not limited to this, and instead of the halogen lamp HL, a discharge type arc lamp (for example, a xenon arc lamp) may be used as a continuously lit lamp to perform preheating. In this case, the warning signal transmitting unit 37 transmits a flash warning signal halfway through the preheating by the arc lamp.

In addition, the substrate to be treated by the heat treatment apparatus 1 is not limited to the semiconductor wafer, and may be a glass substrate used for a flat panel display such as a liquid crystal display apparatus or a substrate for a solar cell. In addition, in the heat treatment apparatus 1, heat treatment of a high dielectric constant gate insulating film (High-k film), bonding of metal and silicon, or crystallization of polysilicon may be performed.

EXPLANATION OF REFERENCE SIGNS

1: heat treatment apparatus
3: control unit
4: halogen heating unit
5: flash heating unit
6: chamber
7: holding unit
10: transfer mechanism
20: lower radiation thermometer
25: upper radiation thermometer
29: infrared sensor
33: input unit
34: display unit
35: cycle determination unit
36, 107: storage unit
37: warning signal transmitting unit
63: upper side chamber window
64: lower side chamber window
65: heat treatment space
74: susceptor
96: IGBT
101: high-speed radiation thermometer unit
105: temperature conversion unit
106: profile creation unit
FL: flash lamp
HL: halogen lamp
W: semiconductor wafer

The invention claimed is:

1. A heat treatment method for irradiating a substrate with a flash of light to heat the substrate, the heat treatment method comprising:
 a flash of light irradiation step of irradiating a surface of a substrate with a flash of light from a flash lamp;
 a temperature measurement step of measuring a surface temperature of said substrate with a radiation thermometer in a preset data collection cycle; and
 a profile creation step of extracting, of a plurality of temperature data acquired in said temperature measurement step, a fixed number of temperature data before and after starting irradiation with said flash of light to create a temperature profile,
 wherein said data collection cycle is made variable, and said data collection cycle is determined according to a waveform of said flash of light applied in said flash of light irradiation step.

2. The heat treatment method according to claim 1, wherein the profile creation step includes:
 setting temperature data acquired a predetermined number of points before temperature data when a temperature measured by said radiation thermometer reaches a threshold value as starting point temperature data, and
 extracting said fixed number of temperature data at and after said starting point temperature data.

3. The heat treatment method according to claim 1, wherein
 said data collection cycle is determined based on a conversion table in which a waveform of a flash of light and a data collection cycle are associated with each other.

4. The heat treatment method according to claim 3, wherein said data collection cycle is lengthened as a waveform of said flash of light applied in said flash of light irradiation step becomes longer.

5. A heat treatment method for irradiating a substrate with a flash of light to heat the substrate, the heat treatment method comprising:
 a flash of light irradiation step of irradiating a surface of a substrate with a flash of light from a flash lamp;
 a preheating step of, before said flash of light irradiation step, preheating said substrate to a preheating temperature with light irradiation from a continuously lit lamp;
 a temperature measurement step of measuring a surface temperature of said substrate with a radiation thermometer in a predetermined data collection cycle;
 a warning step of transmitting a warning signal before starting irradiation with said flash of light; and
 a profile creation step of, after transmitting said warning signal, setting temperature data acquired a predetermined number of points before temperature data when a temperature measured by said radiation thermometer reaches a threshold value as starting point temperature data, and extracting a fixed number of temperature data at and after said starting point temperature data from a plurality of temperature data acquired in said temperature measurement step to create a temperature profile,
 wherein said warning signal is transmitted halfway through said preheating step, and
 said threshold value is set higher than said preheating temperature and lower than a maximum temperature reached by a surface of said substrate by irradiation with said flash of light.

6. A heat treatment method for irradiating a substrate with a flash of light to heat the substrate, the heat treatment method comprising:
 a flash of light irradiation step of irradiating a surface of a substrate with a flash of light from a flash lamp;
 a temperature measurement step of measuring a surface temperature of said substrate with a radiation thermometer in a predetermined data collection cycle; and
 a profile creation step of setting temperature data acquired a predetermined number of points before temperature data when inclination of a temperature measured by said radiation thermometer with respect to time is continuously not less than a threshold value for a certain period of time or more as starting point temperature data, and extracting a fixed number of temperature data at and after said starting point temperature data from a plurality of temperature data acquired in said temperature measurement step to create a temperature profile,
 wherein determining that a flash of light irradiation from said flash lamp has been started when inclination of a temperature measured by said radiation thermometer with respect to time is continuously not less than said threshold value for said certain period of time or more.

7. The heat treatment method according to claim 6,
 further comprising a warning step of transmitting a warning signal before starting irradiation with said flash of light, and
 wherein said profile creation step includes, after transmitting said warning signal, determining inclination of a temperature measured by said radiation thermometer with respect to time.

8. A heat treatment apparatus configured to irradiate a substrate with a flash of light to heat the substrate, the heat treatment apparatus comprising:
 a chamber configured to house a substrate;
 a flash lamp configured to irradiate a surface of said substrate housed in said chamber with a flash of light;
 a radiation thermometer configured to receive infrared light radiated from a surface of said substrate and to measure a temperature of the surface in a preset data collection cycle; and
 a profile creation unit configured to extract, of a plurality of temperature data measured and acquired by said radiation thermometer, a fixed number of temperature data before and after said flash lamp starts irradiation with said flash of light to create a temperature profile,
 wherein said data collection cycle is made variable, and further comprising a cycle determination unit configured to determine said data collection cycle according to a waveform of said flash of light applied by said flash lamp.

9. The heat treatment apparatus according to claim 8, wherein said profile creation unit sets temperature data acquired a predetermined number of points before temperature data when a temperature measured by said radiation thermometer reaches a threshold value as starting point temperature data, and extracts said fixed number of temperature data at and after said starting point temperature data.

10. The heat treatment apparatus according to claim 8,
 further comprising a storage unit configured to store a conversion table that associates a waveform of a flash of light with a data collection cycle, and
 wherein said cycle determination unit determines said data collection cycle based on said conversion table.

11. The heat treatment apparatus according to claim 10, wherein said cycle determination unit lengthens said data collection cycle as a waveform of said flash of light applied by said flash lamp becomes longer.

12. A heat treatment apparatus configured to irradiate a substrate with a flash of light to heat the substrate, the heat treatment apparatus comprising:
   a chamber configured to house a substrate;
   a flash lamp configured to irradiate a surface of said substrate housed in said chamber with a flash of light;
   a continuously lit lamp configured to irradiate said substrate with light before a flash of light is applied from said flash lamp and to perform preheating said substrate to a preheating temperature;
   a radiation thermometer configured to receive infrared light radiated from a surface of said substrate and to measure a temperature of the surface in a predetermined data collection cycle;
   a warning signal transmitting unit configured to transmit a warning signal before irradiation with said flash of light is started by said flash lamp; and
   a profile creation unit configured to, after said warning signal is transmitted, set temperature data acquired a predetermined number of points before temperature data when a temperature measured by said radiation thermometer reaches a threshold value as starting point temperature data, and to extract a fixed number of temperature data at and after said starting point temperature data from a plurality of temperature data measured and acquired by said radiation thermometer to create a temperature profile,
   wherein said warning signal transmitting unit transmits said warning signal halfway through said preheating, and
   said threshold value is set higher than said preheating temperature and lower than a maximum temperature reached by a surface of said substrate by said flash of light irradiation from said flash lamp.

13. A heat treatment apparatus configured to irradiate a substrate with a flash of light to heat the substrate, the heat treatment apparatus comprising:
   a chamber configured to house a substrate;
   a flash lamp configured to irradiate a surface of said substrate housed in said chamber with a flash of light;
   a radiation thermometer configured to receive infrared light radiated from a surface of said substrate and to measure a temperature of the surface in a predetermined data collection cycle; and
   a profile creation unit configured to set temperature data acquired a predetermined number of points before temperature data when inclination of a temperature measured by said radiation thermometer with respect to time is continuously not less than a threshold value for a certain period of time or more as starting point temperature data, and to extract a fixed number of temperature data at and after said starting point temperature data from a plurality of temperature data measured and acquired by said radiation thermometer to create a temperature profile,
   wherein determining that a flash of light irradiation from said flash lamp has been started when inclination of a temperature measured by said radiation thermometer with respect to time is continuously not less than said threshold value for said certain period of time or more.

14. The heat treatment apparatus according to claim 13,
   further comprising a warning signal transmitting unit configured to transmit a warning signal before said flash lamp starts a flash of light irradiation, and
   wherein after said warning signal is transmitted, said profile creation unit determines inclination of a temperature measured by said radiation thermometer with respect to time.

* * * * *